(12) United States Patent
Yamazaki et al.

(10) Patent No.: US 9,748,273 B2
(45) Date of Patent: Aug. 29, 2017

(54) SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Tokyo (JP); Kensuke Yoshizumi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/092,674

(22) Filed: Apr. 7, 2016

(65) Prior Publication Data

US 2016/0225790 A1 Aug. 4, 2016

Related U.S. Application Data

(63) Continuation of application No. 13/768,753, filed on Feb. 15, 2013, now Pat. No. 9,312,257.

(30) Foreign Application Priority Data

Feb. 29, 2012 (JP) .................................. 2012-044109

(51) Int. Cl.
*H01L 27/12* (2006.01)
*H01L 27/04* (2006.01)
(Continued)

(52) U.S. Cl.
CPC .......... *H01L 27/1207* (2013.01); *H01L 27/04* (2013.01); *H01L 27/0688* (2013.01);
(Continued)

(58) Field of Classification Search
USPC ............................... 257/76, 296, E27.084, 77
See application file for complete search history.

(56) References Cited

U.S. PATENT DOCUMENTS 4,466,081 A 8/1984 Masuoka
5,466,961 A 11/1995 Kikuchi et al.
(Continued)

FOREIGN PATENT DOCUMENTS

EP 1737044 A 12/2006
EP 2226847 A 9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Kyoung Lee
*Assistant Examiner* — Ratisha Mehta
(74) *Attorney, Agent, or Firm* — Fish & Richardson P.C.

(57) ABSTRACT

A semiconductor device is described, which includes a first transistor, a second transistor, and a capacitor. The second transistor and the capacitor are provided over the first transistor so as to overlap with a gate of the first transistor. A semiconductor layer of the second transistor and a dielectric layer of the capacitor are directly connected to the gate of the first transistor. The second transistor is a vertical transistor, where its channel direction is perpendicular to an upper surface of a semiconductor layer of the first transistor.

20 Claims, 18 Drawing Sheets

(51) Int. Cl.
*H01L 27/06* (2006.01)
*H01L 27/108* (2006.01)
*H01L 27/1156* (2017.01)
*H01L 29/423* (2006.01)
*G11C 16/10* (2006.01)
*H01L 21/84* (2006.01)
*H01L 27/11521* (2017.01)
*H01L 27/11551* (2017.01)
*H01L 29/24* (2006.01)

(52) U.S. Cl.
CPC ........ *H01L 27/108* (2013.01); *H01L 27/1156* (2013.01); *H01L 29/42384* (2013.01); *G11C 16/10* (2013.01); *H01L 21/84* (2013.01); *H01L 27/10805* (2013.01); *H01L 27/11521* (2013.01); *H01L 27/11551* (2013.01); *H01L 27/1203* (2013.01); *H01L 29/24* (2013.01)

(56) References Cited

U.S. PATENT DOCUMENTS

| | | |
|---|---|---|
| 5,627,390 A | 5/1997 | Maeda et al. |
| 5,731,856 A | 3/1998 | Kim et al. |
| 5,744,864 A | 4/1998 | Cillessen et al. |
| 5,780,888 A | 7/1998 | Maeda et al. |
| 6,150,687 A | 11/2000 | Noble et al. |
| 6,150,688 A | 11/2000 | Maeda et al. |
| 6,294,274 B1 | 9/2001 | Kawazoe et al. |
| 6,303,425 B1 | 10/2001 | Maeda et al. |
| 6,383,860 B2 | 5/2002 | Maeda et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,461,586 B2 | 6/2013 | Yamazaki et al. |
| 8,847,326 B2 | 9/2014 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0303083 A1 | 12/2008 | Oyu |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0202206 A1 | 8/2010 | Seol et al. |
| 2011/0089417 A1 | 4/2011 | Yamazaki et al. |
| 2011/0101337 A1 | 5/2011 | Yamazaki |
| 2011/0101351 A1 | 5/2011 | Yamazaki |
| 2011/0101356 A1 | 5/2011 | Yamazaki |
| 2011/0121284 A1 | 5/2011 | Yamazaki et al. |
| 2011/0121288 A1 | 5/2011 | Yamazaki et al. |
| 2011/0121878 A1 | 5/2011 | Kato et al. |
| 2011/0127522 A1 | 6/2011 | Yamazaki |
| 2011/0127526 A1 | 6/2011 | Kawae et al. |
| 2011/0134683 A1 | 6/2011 | Yamazaki et al. |
| 2011/0175646 A1 | 7/2011 | Takemura et al. |
| 2011/0210339 A1* | 9/2011 | Yamazaki ............... G11C 11/24 257/77 |
| 2011/0233555 A1 | 9/2011 | Endo |
| 2011/0310670 A1 | 12/2011 | Shim et al. |
| 2012/0012837 A1 | 1/2012 | Yamazaki et al. |
| 2012/0043542 A1 | 2/2012 | Yanagisawa |
| 2012/0199842 A1 | 8/2012 | Takemura |
| 2012/0213000 A1 | 8/2012 | Takemura |
| 2012/0228688 A1 | 9/2012 | Matsubayashi |
| 2013/0015436 A1 | 1/2013 | Yamazaki |
| 2013/0099234 A1 | 4/2013 | Yamazaki |
| 2014/0092686 A1 | 4/2014 | Shim et al. |
| 2014/0145255 A1 | 5/2014 | Seol et al. |

(56) References Cited

U.S. PATENT DOCUMENTS

| | | |
|---|---|---|
| 2014/0241065 A1 | 8/2014 | Shim et al. |
| 2016/0056172 A1 | 2/2016 | Shim et al. |

FOREIGN PATENT DOCUMENTS

| | | |
|---|---|---|
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 07-321228 A | 12/1995 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2012-039101 A | 2/2012 |
| WO | WO-2004/114391 | 12/2004 |
| WO | WO-2012/008304 | 1/2012 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

(56) References Cited

OTHER PUBLICATIONS

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

SEMICONDUCTOR DEVICE

CROSS-REFERENCE TO RELATED APPLICATIONS

This application is a continuation of U.S. application Ser. No. 13/768,753, filed Feb. 15, 2013, now allowed, which claims the benefit of a foreign priority application filed in Japan as Serial No. 2012-044109 on Feb. 29, 2012, both of which are incorporated by reference.

BACKGROUND OF THE INVENTION

1. Field of the Invention

The present invention relates to a semiconductor device.

In this specification, a "semiconductor device" refers to any device which can function by utilizing semiconductor characteristics, and a memory device, an electro-optical device, a semiconductor circuit, an electronic component, and an electronic device are each an embodiment of the semiconductor device.

2. Description of the Related Art

A memory device is one of semiconductor devices including semiconductor elements. Memory devices are broadly classified into two categories: a volatile memory device that loses stored data when supply of power is stopped, and a non-volatile memory device that holds stored data even after supply of power is stopped.

Typical examples of volatile memory devices are dynamic random access memories (DRAMs) and static random access memories (SRAMs). Such volatile memory devices lose stored data when supply of power is stopped but consume relatively less power because they do not need high voltage as in non-volatile memories.

The area of a DRAM can be small because one memory element of the DRAM includes only one transistor and one capacitor; however, a data retention period is extremely short, frequent refresh operation is required, and power consumption cannot be sufficiently reduced.

Although an SRAM can operate at high speed, the area of the SRAM is large because one memory element of the SRAM includes at least six transistors. Further, since the off-state current of the transistors are increased due to miniaturization of the transistors, power consumption during a data retention period cannot be sufficiently reduced.

A typical example of a non-volatile memory device is a flash memory. A flash memory holds electric charge in a floating gate and thus has a semi-permanent data retention period (e.g., see Patent Document 1). However, a flash memory consumes large power because it requires high voltage for writing and erasing data, and in addition, it is not easy to increase the speed of these operations. Further, in writing and erasing data, electric charge is injected to a floating gate by generating tunneling current by application of a high electric field to an insulating film, so that degradation of the insulating film proceeds in accordance with the number of writing cycles.

It has recently been found that a transistor formed using an oxide semiconductor with a wide band gap has significantly high off-state resistance, and it has been proposed that the transistor is used to form a memory element or a signal processing circuit which is used for a memory device (see Patent Documents 2 to 4).

Owing to the high off-state resistance of the transistor in such a memory element, it takes a long time for electric charge accumulated in a capacitor connected to the transistor in series to be lost, and this makes it possible to reduce consumption of current required for a general flip-flop circuit in an SRAM or the like to hold data and to further reduce power consumption. Alternatively, a very large capacitor required for a DRAM is not necessary, which allows the size of a circuit to be reduced, the manufacturing process to be simplified, and the yield to be improved.

REFERENCE

Patent Documents

[Patent Document 1] Japanese Published Patent Application No. S57-105889
[Patent Document 2] United States Patent Application Publication No. 2011/0121878
[Patent Document 3] United States Patent Application Publication No. 2011/0134683
[Patent Document 4] United States Patent Application Publication No. 2011/0175646

SUMMARY OF THE INVENTION

In recent years, a reduction in area occupied by elements included in a semiconductor device is required with the progress of high integration of the elements. A reduction in area of a semiconductor device can lead to an increase of the number of semiconductor devices which can be obtained from one substrate and thus to a reduction in cost per semiconductor device. In a memory device, memory elements can be arranged with higher density as the area per memory element is smaller, so that the amount of data per unit area can be increased.

Further, a semiconductor device capable of operating with lower power is desired for a reduction in power consumption of a device including the semiconductor device. In view of the above, a memory device is required to be able to hold data even after supply of power is stopped.

The present invention is made in view of the foregoing technical background. Therefore, an object of an embodiment of the present invention is to provide a semiconductor device with reduced area. Another object is to provide a semiconductor device capable of operating with lower power. Another object is to provide a semiconductor device capable of holding data even after supply of power is stopped.

An embodiment of the present invention achieves at least one of the above objects.

A semiconductor device according to an embodiment of the present invention includes a first transistor, a second transistor, and a capacitor.

In the above semiconductor device, data is written by accumulating electric charge in the capacitor through the second transistor and held by turning off the second transistor. A potential of a node between the second transistor and the capacitor (also referred to as a holding node) is applied to a gate electrode of the first transistor. Data can be read without being destroyed by detecting a conduction state of the first transistor.

Further, the second transistor and the capacitor are formed over the first transistor to overlap with the first transistor, preferably to overlap with the gate electrode of the first transistor. One electrode (a source electrode or a drain electrode) of the second transistor and one electrode of the capacitor are electrically connected to the gate electrode of the first transistor.

In other words, a semiconductor device of an embodiment of the present invention includes a first transistor, a second transistor, and a capacitor. The first transistor includes a first semiconductor layer, a first insulating layer over and in contact with the first semiconductor layer, and a first electrode layer which is over and in contact with the first insulating layer and overlaps with the first semiconductor layer. The second transistor includes a second semiconductor layer which is formed over the first electrode layer to overlap therewith and electrically connected to the first electrode layer, a second insulating layer in contact with a side surface of the second semiconductor layer, a second electrode layer which is in contact with the second insulating layer and covers at least part of the side surface of the second semiconductor layer, and a third electrode layer which is formed over the second semiconductor layer and electrically connected to the second semiconductor layer. The capacitor includes a fourth electrode layer formed over the first electrode layer to overlap therewith and a dielectric layer between the first electrode layer and the fourth electrode layer.

With such a structure, a semiconductor device with reduced area can be obtained.

When data is written to or erased from the semiconductor device, only voltage which makes the second transistor be turned on is needed; therefore, high voltage which is needed for a flash memory is not needed. Accordingly, the semiconductor device can operate with extremely low power.

The first semiconductor layer of the semiconductor device is preferably formed using single crystal silicon.

With such a structure, data held in the semiconductor device can be read at extremely high speed.

A semiconductor device of another embodiment of the present invention includes a first transistor, a second transistor, and a capacitor. The first transistor includes a fifth electrode layer, a first semiconductor layer which is formed over the fifth electrode layer to overlap therewith and electrically connected to the fifth electrode layer, a first insulating layer in contact with a side surface of the first semiconductor layer, a first electrode layer which is in contact with the first insulating layer and covers at least part of the side surface of the first semiconductor layer, and a sixth electrode layer which is formed over the first semiconductor layer and electrically connected to the first semiconductor layer. The second transistor includes a second semiconductor layer which is formed over the first electrode layer to overlap therewith and electrically connected to the first electrode layer, a second insulating layer in contact with a side surface of the second semiconductor layer, a second electrode layer which is in contact with the second insulating layer and covers at least part of the side surface of the second semiconductor layer, and a third electrode layer which is formed over the second semiconductor layer and electrically connected to the second semiconductor layer. The capacitor includes a fourth electrode layer formed over the first electrode layer to overlap therewith and a dielectric layer between the first electrode layer and the fourth electrode layer.

With such a structure, an area of the first transistor can be reduced, so that an area of the semiconductor device can be further reduced.

Further, in any of the semiconductor devices, the second semiconductor layer preferably includes a semiconductor whose band gap is wider than that of silicon.

Thus, a transistor having reduced off-state current can be used as the second transistor. Accordingly, a potential held in a holding node can be held for a long time even after supply of power is stopped. Therefore, the semiconductor device can hold data even after supply of power is stopped.

The semiconductor of the second semiconductor layer is preferably an oxide semiconductor.

The oxide semiconductor preferably includes In, Ga, and Zn.

As described above, an oxide semiconductor is preferably used particularly as the semiconductor included in a channel of the second transistor. The oxide semiconductor whose band gap is wider than that of silicon can realize small off-state current.

In particular, in the case where an oxide semiconductor including In, Ga, and Zn is used for a transistor, even when the oxide semiconductor is in an amorphous state formed at relatively low temperature, the transistor has favorable electric characteristics (e.g., high field-effect mobility or a small S value) and high reliability compared to a transistor including another oxide semiconductor, which is preferable. For example, zinc oxide which is one of oxide semiconductors is likely to be in a polycrystalline state at low temperature, and it is difficult to obtain desired electric characteristics such as high field-effect mobility and a small S value due to grain boundaries.

Further, in the semiconductor device including the semiconductor whose band gap is wider than that of silicon, the dielectric layer is preferably formed using the same film as the second semiconductor layer.

The semiconductor used for the second semiconductor layer can also be used for the dielectric layer included in the capacitor because of its extremely high resistance. Therefore, in any of the above structures, the second transistor and the capacitor can be formed over a gate electrode of the first transistor through a common process. Thus, a process of manufacturing the semiconductor device can be simplified and the semiconductor device can be manufactured at low cost with high yield.

In any of the semiconductor devices, a driver circuit is preferably provided below the first transistor.

In this manner, the area of the semiconductor device including a driver circuit in a lower portion can be smaller than the area of a semiconductor device in which a driver circuit is provided without overlapping with an element such as a first transistor, a second transistor, or a capacitor.

Further, in any of the semiconductor devices, a plurality of layers of semiconductor devices each including the first transistor, the second transistor, and the capacitor is preferably stacked.

In this manner, a plurality of layers of semiconductor devices each of which is an embodiment of the present invention can be stacked. Such a stack-type semiconductor device can achieve high integration, and thus the amount of data which can be held in the area occupied by one semiconductor device can be increased.

Note that a memory device is an embodiment of a semiconductor device in this specification. A memory device refers to a device capable of holding at least a storage state of data. A device which includes a plurality of memory devices each holding a storage state of data is also an embodiment of the memory device. Further, a module in which a driver circuit or an integrated circuit (IC) for driving a memory device is mounted on the memory device is also a memory device.

According to the present invention, a semiconductor device with reduced area can be provided. Further, a semiconductor device capable of operating with low power can be provided. Furthermore, a semiconductor device capable of holding data even after supply of power is stopped can be provided.

DETAILED DESCRIPTION OF THE INVENTION

Figure 1A:
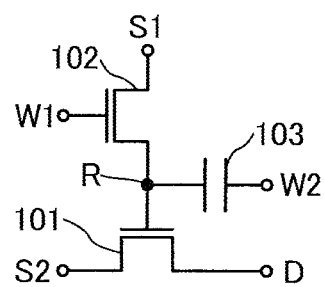
FIGS. 1A and 1B illustrate a semiconductor device according to an embodiment of the present invention.

Embodiments of the present invention will be described in detail with reference to the drawings. Note that the present invention is not limited to the following description, and it will be easily understood by those skilled in the art that modes and details of the present invention can be modified in various ways without departing from the spirit and scope of the present invention. Therefore, the present invention should not be construed as being limited to the description in the following embodiments. Note that in the structures of the present invention described below, the same portions or portions having similar functions are denoted by the same reference numerals in different drawings, and description of such portions is not repeated.

Note that in each drawing described in this specification, the size, the layer thickness, or the region of each component is exaggerated for clarity in some cases. Therefore, embodiments of the present invention are not limited to such scales.

A transistor is a kind of semiconductor elements and can achieve amplification of current or voltage, switching operation for controlling conduction or non-conduction, or the like. A transistor in this specification includes an insulated-gate field effect transistor (IGFET) and a thin film transistor (TFT).

Functions of a "source" and a "drain" are sometimes replaced with each other when a transistor of opposite polarity is used or when the direction of current flowing is changed in circuit operation, for example. Therefore, the terms "source" and "drain" can be used to denote the drain and the source, respectively, in this specification.

In this specification and the like, one of a source and a drain of a transistor is called a "first electrode" and the other of the source and the drain is called a "second electrode" in some cases. Note that a gate is referred to as a "gate" or a "gate electrode".

Note that in this specification and the like, the term "electrically connected" includes the case where components are connected through an object having any electric function. There is no particular limitation on an object having any electric function as long as electric signals can be transmitted and received between components that are connected through the object. Examples of an "object having any electric function" include a switching element such as a transistor, a resistor, a coil, a capacitor, and an element with a variety of functions in addition to an electrode and a wiring.

Note that a node in this specification and the like means an element (e.g., a wiring) which enables electric connection between elements included in a circuit. Therefore, a "node to which A is connected" is a wiring which is electrically connected to A and can be regarded as having the same potential as A. Note that even when one or more elements which enable electrical connection (e.g., switches, transistors, capacitors, inductors, resistors, or diodes) are in a portion of the wiring, the wiring can be regarded as the "node to which A is connected" as long as it has the same potential as A.

In this specification and the like, when two or more components are formed from the same material at the same time, these components are defined as exiting in the same layer. For example, when a layer is formed and then subjected to etching and so on to produce a component A and a component B, they are regarded as the components exiting in the same layer.

Embodiment 1

In this embodiment, as an example of a semiconductor device of an embodiment of the present invention, an example of a structure of a memory device will be described with reference to drawings.

FIG. 1A is a circuit diagram of a main portion of the memory device of an embodiment of the present invention. The memory device includes a transistor 101, a transistor 102, and a capacitor 103.

The memory device includes a node (holding node R) to which a gate electrode of the transistor 101, a first electrode of the transistor 102, and one electrode of the capacitor 103 are electrically connected.

A wiring S2 is electrically connected to a first electrode of the transistor 101 and a wiring D is electrically connected to a second electrode of the transistor 101. A wiring W1 is electrically connected to a gate electrode of the transistor 102 and a wiring S1 is electrically connected to a second electrode of the transistor 102. A wiring W2 is electrically connected to the other electrode of the capacitor 103.

When data is written to the memory device, a potential for turning on the transistor 102 is input to the wiring W1 and a predetermined potential is input to the second electrode of the transistor 102 from the wiring S1, so that the predetermined potential can be written to the holding node R through the transistor 102. After that, a potential for turning off the transistor 102 is input to the wiring W1, so that the potential written to the holding node R is held.

The transistor 101 whose gate electrode is connected to the holding node R is either in an on state or an off state depending on a potential held in the holding node R. Therefore, data can be read by inputting a potential for reading data to one of the wiring S2 and the wiring D and detecting a potential of the other.

Thus, when data is written to or erased from the memory device of an embodiment of the present invention, only voltage for turning on the transistor 102 is needed. That is, as voltage needed for writing data to the holding node R, only voltage for controlling an on state and an off state of the transistor 101 is needed. Accordingly, unlike a flash memory, the memory device of an embodiment of the present invention does not need high voltage in driving, whereby power consumption of the memory device can be significantly reduced.

As the transistor 102, a transistor with reduced leakage current in an off state (off-state current) compared to a transistor including silicon for a semiconductor where a channel is formed is preferably used. Specifically, a transistor including a semiconductor whose band gap is wider than that of silicon as a semiconductor where a channel is formed is used. A compound semiconductor is an example of the semiconductor whose band gap is wider than that of silicon. Examples of the compound semiconductor include an oxide semiconductor, a nitride semiconductor, and the like.

Specifically, the band gap of silicon (1.1 eV) is not high enough to give very high off-state resistance. It is preferable to use a wide band gap semiconductor whose band gap is greater than or equal to 2.5 eV and less than or equal to 4 eV, preferably greater than or equal to 3 eV and less than or equal to 3.8 eV. For example, an oxide semiconductor such as indium oxide or zinc oxide, a nitride semiconductor such as gallium nitride, or a sulfide semiconductor such as zinc sulfide may be used.

In particular, an oxide semiconductor is preferably used as the semiconductor where the channel of the transistor 102 is formed. An oxide semiconductor has a wide energy gap of 3.0 eV or greater. In a transistor obtained by processing an oxide semiconductor under appropriate conditions, the leakage current per 1 μm of channel width between a source and a drain in the off state (off-state current) can be 100 zA ($1\times10^{-19}$ A) or lower or 10 zA ($1\times10^{-20}$ A) or lower, and further can be 1 zA ($1\times10^{-21}$ A) or lower with a source-drain voltage of 3.5 V at an operating temperature (e.g., at 25° C.). Thus, a semiconductor device with low power consumption can be provided.

In particular, in the case where an oxide semiconductor including In, Ga, and Zn is used for a transistor, even when the oxide semiconductor is formed in an amorphous state at relatively low temperature, the transistor has favorable electric characteristics (e.g., high field-effect mobility or a small S value) and high reliability compared to a transistor including another oxide semiconductor, which is preferable. For example, zinc oxide which is one of oxide semiconductors is likely to be in a polycrystalline state at low temperature, and it is difficult to obtain desired electric characteristics such as high field-effect mobility and a small S value due to grain boundaries.

In this manner, with the use of a transistor with reduced off-state current as the transistor 102, a potential held in the holding node R can be held for a long time. Further, data can be held even after supply of power to the memory device is stopped.

Figure 1B:
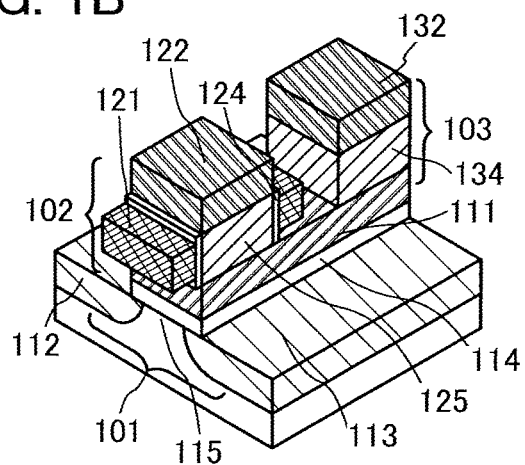

FIG. 1B is a schematic view of the memory device of an embodiment of the present invention.

In the memory device, the transistor 102 and the capacitor 103 are stacked over the transistor 101.

The transistor 101 is a transistor that includes a single crystal semiconductor as a semiconductor where a channel is formed. The transistor 101 includes a semiconductor layer 115, a first electrode layer 112 and a second electrode layer 113 which are electrically connected to the semiconductor layer 115, a gate insulating layer 114 over and in contact with the semiconductor layer 115, and a gate electrode layer 111 which is over and in contact with the gate insulating layer 114 and overlaps with a channel formation region in the semiconductor layer 115. A channel direction of the transistor 101 is parallel to an upper surface of the semiconductor layer 115.

The transistor 102 includes a semiconductor layer 125 which is formed over the gate electrode layer 111 and electrically connected to the gate electrode layer 111, an electrode layer 122 which is formed over the semiconductor layer 125 and electrically connected to the semiconductor layer 125, a gate insulating layer 124 formed in contact with a side surface of the semiconductor layer 125, and a gate electrode layer 121 which is in contact with the gate insulating layer 124 and faces the side surface of the semiconductor layer 125. The transistor 102 is a so-called vertical transistor. Thus, a channel direction of the transistor 102 is perpendicular to that of the transistor 101 and to the upper surface of the semiconductor layer 115.

The capacitor 103 includes an electrode layer 132 stacked over the gate electrode layer 111 and a dielectric layer 134 between the gate electrode layer 111 and the electrode layer 132. Hence, the channel of the transistor 101 overlaps with the semiconductor layer 125 of the transistor 102 and the dielectric layer 134 of the capacitor 103.

Here, the electrode layer 122 is electrically connected to the wiring S1 in FIG. 1A. The gate electrode layer 121, the electrode layer 132, the first electrode layer 112, and the second electrode layer 113 are electrically connected to the wiring W1, the wiring W2, the wiring S2, and the wiring D, respectively. The gate electrode layer 111 corresponds to the holding node R.

As illustrated in FIG. 1B, when the transistor 102 which is a vertical transistor and the capacitor 103 are stacked over the gate electrode layer 111 of the transistor 101, the area of the memory device can be reduced. Further, the gate electrode layer 111 also serves as one electrode of the transistor 102 and one electrode of the capacitor 103, so that the memory device can have a simple structure and can be manufactured at lower cost.

In particular, when a single crystal semiconductor is used for the transistor 101 for reading data, data can be read at high speed.

When a material whose band gap is wider than that of silicon is used for a semiconductor included in the semiconductor layer 125, the material can be used also for a dielectric layer of the capacitor because of its extremely high resistance. In this case, as illustrated in FIG. 1B, the dielectric layer 134 of the capacitor 103 preferably includes the same material as the semiconductor layer 125 of the transistor 102. In other words, it is preferred that the semiconductor layer 125 and the dielectric layer 134 exist in the same layer. With such a structure, the transistor 102 and the capacitor 103 can be manufactured through a common manufacturing process, so that the process of manufacturing the memory device can be simplified and the memory device can be manufactured at low cost with high yield.

Figure 2A:
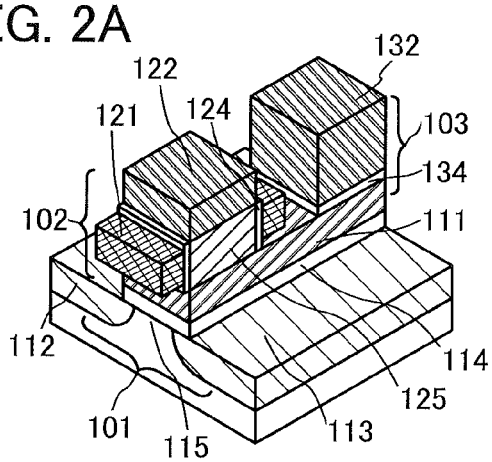
FIGS. 2A to 2C illustrate semiconductor devices according to embodiments of the present invention.

Alternatively, as illustrated in FIG. 2A, a thin film of an insulating material may be used as the dielectric layer 134 of the capacitor 103. When a thin film of an insulating material is used as the dielectric layer 134, the thickness of the dielectric layer 134 can be small and the capacitance of the capacitor 103 can be increased.

The channel length of the transistor 102 can be controlled by changing the thickness of the semiconductor layer 125. Accordingly, a channel length can be controlled by the thickness of the semiconductor layer 125 even when a line width of the gate electrode layer 111, the electrode layer 122, or the like is extremely small due to miniaturization.

Figure 2B:
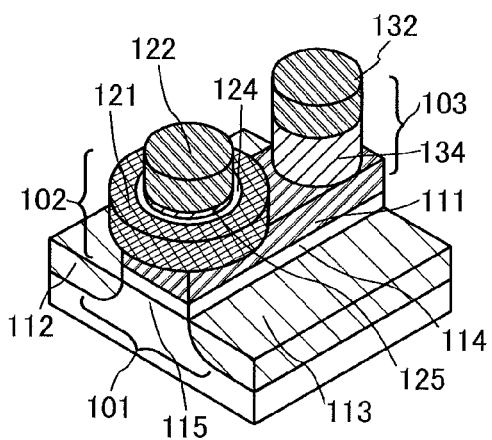
Figure 2C:
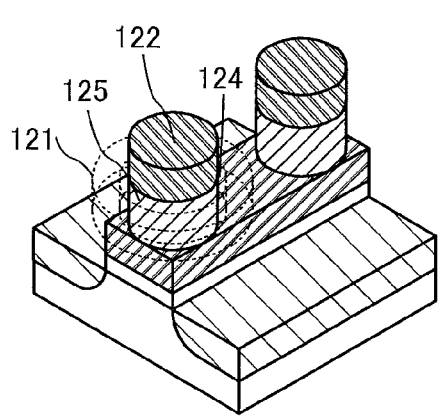

The semiconductor layer 125 has a prismatic shape in FIG. 1B and FIG. 2A but may have another shape. FIG. 2B is a schematic view of the case where the semiconductor layer 125 has a cylindrical shape. In FIG. 2C, the gate electrode layer 121 and the gate insulating layer 124 in FIG. 2B are illustrated by dashed lines.

For example, when the semiconductor layer 125 has a prismatic shape, the effective width of the channel formed near the side surface of the semiconductor layer 125 can be large, so that on-state current of the transistor 102 can be increased. In contrast, when the semiconductor layer 125 has a cylindrical shape as illustrated in FIGS. 2B and 2C, a side surface thereof is not projected, so that a gate electric field can be uniformly applied to the whole of the side surface and the transistor 102 can have high reliability. In order to further increase the on-state current, the shape of a bottom surface of the semiconductor layer 125 may be, for example, a polygon that contains at least one interior angle larger than 180° (a concave polygon), such as a star polygon, so that the effective channel width can be increased.

In FIG. 1B, although the gate electrode layer 121 faces part of the side surface of the semiconductor layer 125 with the gate insulating layer 124 provided therebetween, the gate electrode layer 121 may cover at least part of the side surface of the semiconductor layer 125. For example, the gate electrode layer 121 may surround the outer periphery of the semiconductor layer 125, or the gate electrode layer 121 may be provided on one side surface of the semiconductor layer 125, whereby the degree of integration can be increased. When the gate electrode layer 121 surrounds the side surface of the semiconductor layer 125 as illustrated in FIGS. 2B and 2C, the effective channel width of the transistor 102 can be large and thus on-state current can be increased.

In the memory device described in this embodiment as an example, the transistor 102 and the capacitor 103 are stacked over the transistor 101 and a vertical transistor is used as the transistor 102; therefore, the area of the memory device can be significantly reduced. Further, high voltage is not needed for writing and erasing data, so that the memory device can operate with extremely low power.

Furthermore, since a transistor with reduced off-state current is used as the transistor 102, data can be held even after supply of power is stopped and can be held for an extremely long time.

This embodiment can be combined with any of the other embodiments disclosed in this specification as appropriate.

Embodiment 2

In this embodiment, as an example of a semiconductor device of an embodiment of the present invention, another example of a structure of a memory device will be described with reference to drawings. Note that description of the same portions as those in the above embodiment is omitted or simplified.

Structure Example

Figure 3A:
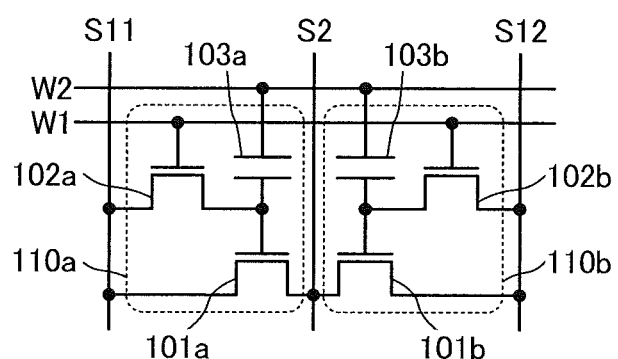
FIGS. 3A and 3B illustrate a semiconductor device according to an embodiment of the present invention.

FIG. 3A is a circuit diagram of a main portion of the memory device which is described as an example in this embodiment.

Here, one memory element includes two transistors and one capacitor.

The memory device illustrated in FIG. 3A includes a memory element 110a including a transistor 101a, a transistor 102a, and a capacitor 103a and a memory element 110b including a transistor 101b, a transistor 102b, and a capacitor 103b. The structures of the memory elements 110a and 110b can be similar to that of the memory device described in Embodiment 1.

In the memory device, the wiring W1 is electrically connected to gates of the transistor 102a and the transistor 102b, the wiring W2 is electrically connected to one electrode of each of the capacitor 103a and the capacitor 103b, a wiring S11 is electrically connected to first electrodes of the transistor 102a and the transistor 101a, a wiring S12 is electrically connected to first electrodes of the transistor 102b and the transistor 101b, and the wiring S2 is electrically connected to second electrodes of the transistor 101a and the transistor 101b.

In this manner, the wiring S11 (or the wiring S12) serves as both the wiring S1 and the wiring D in Embodiment 1 and the wiring S2 is used in common between adjacent memory elements, so that the number of wirings can be reduced.

Although a structure including two memory elements is illustrated in FIG. 3A for simplicity, pairs of two memory elements are practically preferably arranged in a periodic manner along the wiring W1, the wiring S2, and the like.

Next, the operation of the memory device illustrated in FIG. 3A is described.

In data writing, a potential for turning on the transistor 102a and the transistor 102b is applied to the wiring W1. Then, a desired potential is applied to each of the wiring S11 and the wiring S12, so that data can be written to a holding node of each memory element through the transistor 102a or the transistor 102b.

In data reading, a common potential is applied to the wiring S2. When the holding node of the memory element 110a holds a potential for turning on the transistor 101a or the holding node of the memory element 110b holds a potential for turning on the transistor 101b, the potential of the wiring S11 or the wiring S12 is changed. On the other hand, when a potential of the holding node of the memory element 110a is a potential for turning off the transistor 101a or a potential of the holding node of the memory element 110b is a potential for turning off the transistor 101b, the potential of the wiring S11 or the wiring S12 is not changed. Therefore, data written to each memory element can be read in such a manner that a change in the potential of the wiring S11 or the wiring S12 is detected by a sense amplifier or the like.

Here, in the case where data of another memory element provided along the wiring S2 is read, the transistor 101a and the transistor 101b are required to be surely turned off. In this case, a desired potential is applied to the wiring W2, so that the potentials of holding nodes are changed to potentials for turning off the transistor 101a and the transistor 101b through the capacitor 103a and the capacitor 103b. In this manner, data of another memory element provided along the wiring S2 can be surely read.

The above is the description of the operation of the memory device.

Figure 3B:
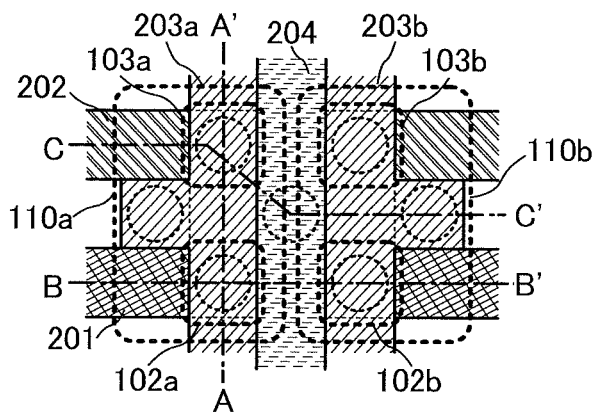

FIG. 3B is a schematic top view of the memory device described in this embodiment.

In FIG. 3B, a wiring layer 201 serving as the wiring W1, a wiring layer 202 serving as the wiring W2, a wiring layer 203a serving as the wiring S11, a wiring layer 203b serving as the wiring S12, and a wiring layer 204 serving as the wiring S2 are illustrated.

The transistor 102a is provided in a region where the wiring layer 201 and the wiring layer 203a overlap with each other. The transistor 102b is provided in a region where the wiring layer 201 and the wiring layer 203b overlap with each other. The capacitor 103a is provided in a region where the wiring layer 202 and the wiring layer 203a overlap with each other. The capacitor 103b is provided in a region where the wiring layer 202 and the wiring layer 203b overlap with each other.

Figure 4A:
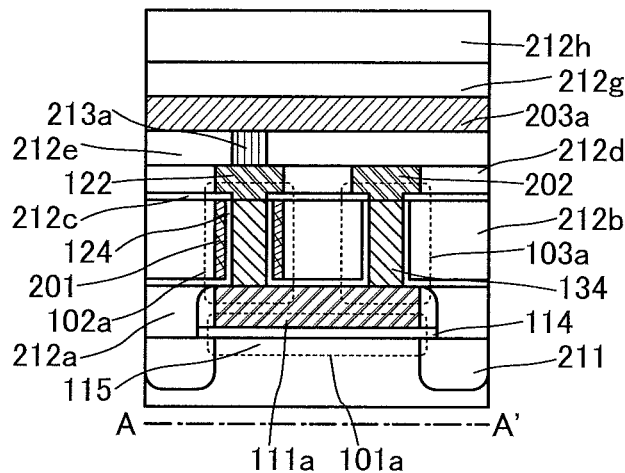
FIGS. 4A to 4C illustrate a semiconductor device according to an embodiment of the present invention.
Figure 4B:
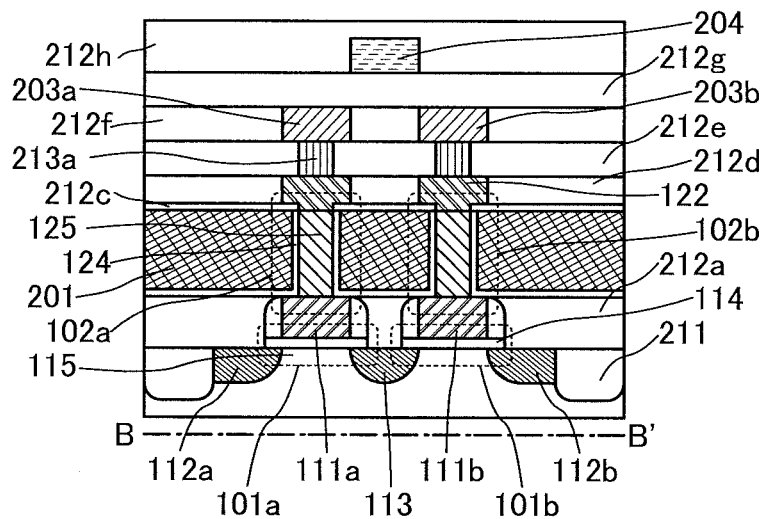
Figure 4C:
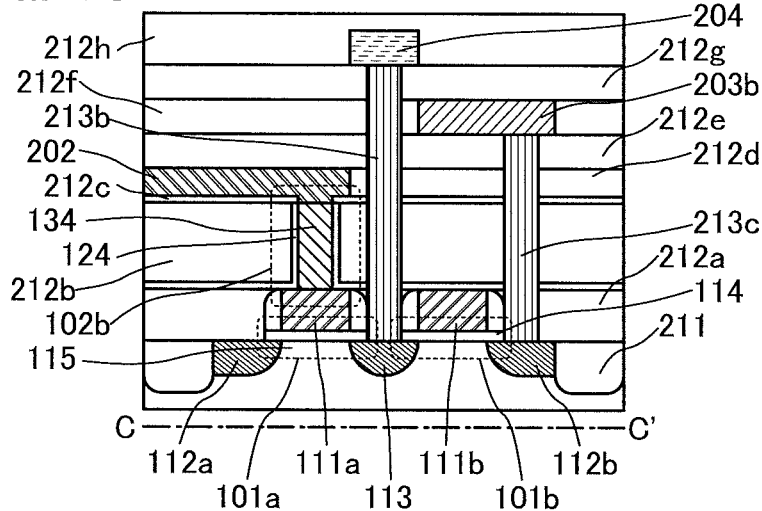

FIGS. 4A to 4C are schematic cross-sectional views taken along line A-A', line B-B', and line C-C' in FIG. 3B, respectively. FIG. 4A is a schematic cross-sectional view of a region including the transistor 102a and the capacitor 103a, which is taken along the wiring layer 203a. FIG. 4B is a schematic cross-sectional view of a region including the transistor 102a and the transistor 102b, which is taken along the wiring layer 201. FIG. 4C is a schematic cross-sectional view of a region including the wiring layer 202, the capacitor 103a, connection electrode layer 213b, and a connection electrode layer 213c.

In the memory element 110a, the transistor 102a and the capacitor 103a are stacked over a gate electrode layer 111a of the transistor 101a. In the memory element 110b, the transistor 102b and the capacitor 103b are stacked over a gate electrode layer 111b of the transistor 101b.

The transistor 101a and the transistor 101b each include a single crystal semiconductor as a semiconductor where a channel is formed.

The transistor 101a includes the semiconductor layer 115, a first electrode layer 112a and the second electrode layer 113 which are electrically connected to the semiconductor layer 115, the gate insulating layer 114 over and in contact with the semiconductor layer 115, and the gate electrode layer 111a which is over and in contact with the gate insulating layer 114 and overlaps with the semiconductor layer 115.

Similarly, the transistor 101b includes the semiconductor layer 115, a first electrode layer 112b, the second electrode layer 113, the gate insulating layer 114, and the gate electrode layer 111b.

The first electrode layer 112b of the transistor 101b is electrically connected to the wiring layer 203b through the connection electrode layer 213c. Similarly, the first electrode layer 112a of the transistor 101a is electrically connected to the wiring layer 203a through the connection wiring layer 213c (not illustrated). Further, the second electrode layer 113 which is included in common between the transistor 101a and the transistor 101b is electrically connected to the wiring layer 204 through the connection electrode layer 213b.

As illustrated in FIGS. 4A to 4C, sidewall insulating layers may be formed on side surfaces of the gate electrode layer 111a and the gate electrode layer 111b.

The transistor 102a includes the semiconductor layer 125 in contact with an upper surface of the gate electrode layer 111a, the electrode layer 122 in contact with an upper surface of the semiconductor layer 125, and the gate insulating layer 124 in contact with a side surface of the semiconductor layer 125. Further, the wiring layer 201 is provided in contact with the gate insulating layer 124 to surround the side surface of the semiconductor layer 125. Part of the wiring layer 201 serves as a gate electrode of the transistor 102a. Thus, the gate electrode of the transistor 102a is located between the gate electrode layer 111a of the transistor 101a and the electrode layer 122 of the transistor 102a.

Similarly, the transistor 102b includes the semiconductor layer 125 in contact with the gate electrode layer 111b, the electrode layer 122, and the gate insulating layer 124. A side surface of the semiconductor layer 125 is surrounded by the wiring layer 201. A gate electrode of the transistor 102b is also located between the gate electrode layer 111b of the transistor 101b and the electrode layer 122 of the transistor 102b.

The electrode layer 122 of the transistor 102a is electrically connected to the wiring layer 203a through the connection electrode layer 213a. The electrode layer 122 of the transistor 102b is electrically connected to the wiring layer 203b also through the connection electrode layer 213a.

The capacitor 103a includes the dielectric layer 134 over and in contact with the gate electrode layer 111a of the transistor 101a. The wiring layer 202 is provided in contact with an upper surface of the dielectric layer 134. Part of the wiring layer 202 serves as one electrode of the capacitor 103a. The dielectric layer 134 is formed using the same layer as the semiconductor layer 125. That is, the dielectric layer 134 exists in the same layer as the semiconductor layer 125.

The capacitor 103b also includes the dielectric layer 134 over and in contact with the gate electrode layer 111b and the wiring layer 202 is provided in contact with the upper surface of the dielectric layer 134.

As illustrated in FIGS. 4A to 4C, insulating layers 212a to 212h are provided between electrode layers, wiring layers, and an electrode layer and a wiring layer so that the electrode layers and the wiring layers included in the memory device are electrically isolated from one another.

An element separation layer 211 for electrically isolating transistors including the semiconductor layer 115 is provided in a substrate serving as the semiconductor layer 115.

Here, in the memory device described as an example in this embodiment, the width of an electrode layer or a wiring layer, and the distance between electrode layers, wiring layers, or an electrode layer and a wiring layer can be the minimum feature size in the employed manufacturing process. Given that the minimum feature size is F, the value of F is preferably smaller than or equal to 100 nm, more preferably smaller than or equal to 50 nm, still more preferably smaller than or equal to 30 nm.

In this structure example, the areas of the transistor 102a which is a vertical transistor and the capacitor 103a can be reduced to $F^2$.

Thus, an electrode layer serves as both one electrode layer of the transistor 101a and one electrode layer of the transistor 101b, so that the two memory elements can be arranged as close as possible. Further, when the transistor 102a and the capacitor 103a are stacked over the gate electrode layer 111a of the transistor 101a, the area of one memory element can be reduced.

The above is the description of the structure example of the memory device described as an example in this embodiment.

Modification Example

In the above structure example, the same layer as the semiconductor layer of the vertical transistor is used as the dielectric layer of the capacitor (that is, the dielectric layer and the semiconductor layer exist in the same layer). In the following, the case where a thin film of an insulating material is used as the dielectric layer is described.

Figure 5:
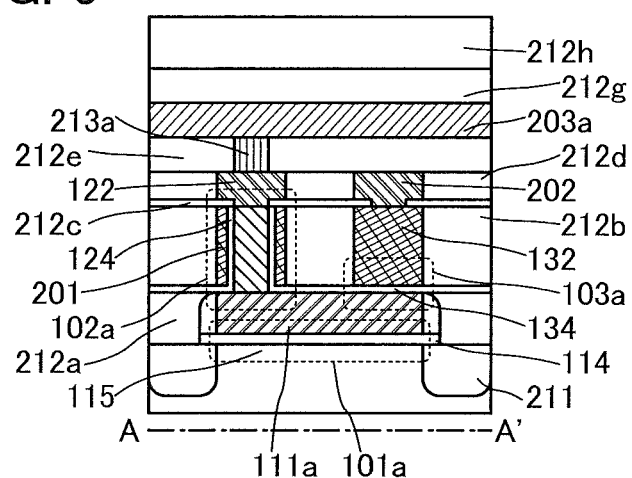
FIG. 5 illustrates a semiconductor device according to an embodiment of the present invention.

FIG. 5 is a schematic cross-sectional view in which the structure of the capacitor 103a is different from that in FIG. 4A. Note that the structures other than the structure of the capacitor 103a are similar to those in the above structure example.

The capacitor 103a includes the dielectric layer 134 over and in contact with the gate electrode layer 111a of the transistor 101a and the electrode layer 132 in contact with the upper surface of the dielectric layer 134. The wiring layer 202 is provided in contact with an upper surface of the electrode layer 132.

The dielectric layer 134 is formed using a thin film of an insulating material. With such a structure, the dielectric layer 134 can be thin, so that capacitance per unit area can be increased.

Here, as illustrated in FIG. 5, the dielectric layer 134 preferably exists in the same layer as the gate insulating layer 124 of the transistor 102a. Further, the electrode layer 132 preferably exists in the same layer as the wiring layer 201. When the dielectric layer 134 and the electrode layer 132 are formed using the same layers included in the transistor 102a, the capacitor 103a and the transistor 102a can be formed through the same process, so that the manufacturing process can be simplified.

The above is the description of this modification example.

<Example of Manufacturing Process>

An example of a method for manufacturing the memory device described in the above structure example is described below with reference to drawings. In this example of the manufacturing process, with a few exceptions, just an outline is described. Refer to a known technique for manufacturing a semiconductor integrated circuit for the details.

Figure 6A:
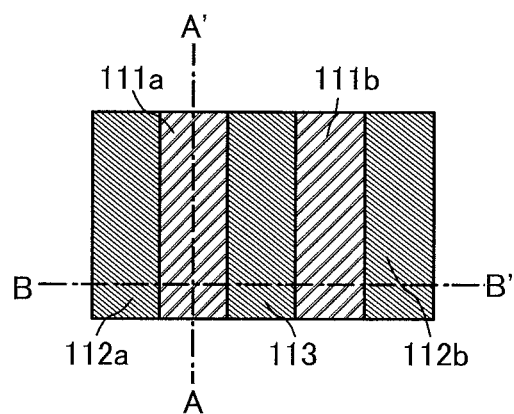
FIGS. 6A and 6B illustrate an example of a process of manufacturing a semiconductor device according to an embodiment of the present invention.
Figure 6B:
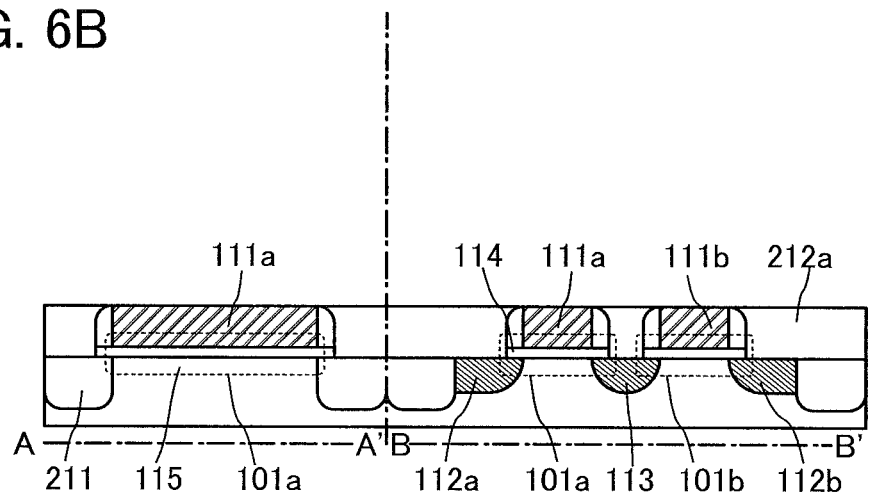

FIGS. 6A and 6B, FIGS. 7A and 7B, FIGS. 8A and 8B, and FIGS. 9A and 9B are schematic top views and schematic cross-sectional views at respective stages in this example of the manufacturing process. For example, FIG. 6A is a schematic top view at a stage and FIG. 6B is a schematic cross-sectional view taken along line A-A' and line B-B' in FIG. 6A.

First, a substrate including a semiconductor material is prepared. As the substrate containing a semiconductor material, a single crystal semiconductor substrate or a microcrystalline semiconductor substrate of silicon, silicon carbide, or the like; a compound semiconductor substrate of silicon germanium or the like; an SOI substrate; or the like can be used. Here, an example of the case where a single crystal silicon substrate is used as the substrate including a semiconductor material is described. Note that in general, the "SOI substrate" means a substrate in which a silicon semiconductor layer is provided on an insulating surface. In this specification and the like, the "SOI substrate" also includes a substrate in which a semiconductor layer containing a material other than silicon is provided on an insulating surface. That is, the "SOI substrate" includes a structure in which a semiconductor layer is provided over an insulating substrate such as a glass substrate with an insulating layer interposed therebetween.

Next, the element separation layer 211 is formed in the substrate. The element separation layer 211 may be formed by a known local oxidation of silicon (LOCOS) process or the like. Before or after this step, an impurity element imparting n-type conductivity or an impurity element imparting p-type conductivity may be added to the substrate in order to control the threshold voltages of the transistor 101a and the transistor 101b formed later. In the case where the semiconductor material included in the substrate is silicon, phosphorus, arsenic, or the like can be used as an impurity imparting n-type conductivity, for example. Boron, aluminum, gallium, or the like can be used as an impurity imparting p-type conductivity, for example.

The surface of the substrate is preferably planarized after the element separation layer 211 is formed. For example, etching treatment or polishing treatment such as chemical mechanical polishing (CMP) may be performed.

Then, an insulating film is formed over the surface of the substrate, and a conductive film is formed over the insulating film.

The insulating film serves as the gate insulating layers 114 of the transistor 101a and the transistor 101b formed later, and the insulating film preferably has a single-layer structure or a stacked structure using a film containing any of silicon oxide, silicon oxynitride, silicon nitride oxide, silicon nitride, hafnium oxide, aluminum oxide, tantalum oxide, yttrium oxide, hafnium silicate ($HfSi_xO_y$ (x>0, y>0)), hafnium silicate to which nitrogen is added, hafnium aluminate ($HfAl_xO_y$ (x>0, y>0)) to which nitrogen is added, and the like formed by a CVD method, a sputtering method, or the like. Alternatively, the surface of the substrate may be oxidized or nitrided by high-density plasma treatment or heat treatment (such as thermal oxidation treatment or thermal nitridation treatment), whereby the insulating film is formed. The high-density plasma treatment can be performed using, for example, a mixed gas of a rare gas such as He, Ar, Kr, or Xe and a gas such as oxygen, nitrogen oxide, ammonia, or nitrogen. There is no particular limitation on the thickness of the insulating film, and for example, the insulating film can have a thickness greater than or equal to 1 nm and less than or equal to 100 nm.

The conductive film serves as the gate electrode layers 111a and 111b of the transistor 101a and the transistor 101b formed later, and can be formed using a metal material such as aluminum, copper, titanium, tantalum, tungsten, chromium, nickel, or molybdenum. Alternatively, the conductive film can be formed using a semiconductor material such as polycrystalline silicon containing a conductive material. There is no particular limitation on the method for forming the conductive film, and any kind of film formation methods such as an evaporation method, a CVD method, a sputtering method, and a spin coating method can be employed. Note that this embodiment shows an example of the case where the conductive film is formed using a metal material.

Since the conductive film also serves as one electrode of each of the transistor 102a and the transistor 102b formed later, a material of the conductive film is preferably selected in consideration of the electron affinity of a semiconductor material used for the semiconductor layer 125. Further, the conductive film may have a stacked structure including two or more conductive films, in which the uppermost conductive film (the layer in contact with the semiconductor layer 125) is formed using a material suitable for the electrodes of the transistor 102a and the transistor 102b.

Next, an unnecessary portion of the conductive film is etched, so that the gate electrode layer 111a and the gate electrode layer 111b are formed.

Next, sidewall insulating layers in contact with the side surfaces of the gate electrode layer 111a and the gate electrode layer 111b are formed. An insulating film is formed so as to cover the gate electrode layer 111a and the gate electrode layer 111b and then subjected to highly anisotropic etching, whereby the sidewall insulating layers can be formed in a self-aligned manner.

In the etching treatment in the formation of the sidewall insulating layers, part of the insulating film serving as the gate insulating layer 114, which does not overlap with any of the gate electrode layer 111a, the gate electrode layer 111b, and the sidewall insulating layers, is etched at the same time, so that the gate insulating layer 114 is formed.

By provision of the sidewall insulating layers, impurity regions to which an impurity element is added at different concentrations can be formed in a later step of adding an impurity. Thus, adverse effects such as a short channel effect can be suppressed, which is preferable. Note that when high integration is required, a structure without a sidewall is employed, whereby the size of the transistor can be reduced.

Next, an impurity such as phosphorus or arsenic is added with the use of the gate electrode layer 111a, the gate electrode layer 111b, and the sidewall insulating layers as masks, whereby the first electrode layer 112a, the first electrode layer 112b, and the second electrode layer 113 are formed. Note that an impurity element such as boron or aluminum may be added in the case of forming a p-channel transistor, and an impurity element such as phosphorus or arsenic may be added in the case of forming an n-channel transistor. The concentration of the impurity added can be set as appropriate; the concentration of the impurity added is preferably increased in the case where the semiconductor element is highly miniaturized. Note that it is preferable to perform heat treatment after an impurity element is added in order to activate the impurity element, to reduce defects which might be generated during addition of the impurity element, or the like.

Through the above steps, the transistor 101a and the transistor 101b can be formed.

After that, an insulating film serving as the insulating layer 212a is formed and planarization treatment is performed so as to expose the gate electrode layer 111a and the gate electrode layer 111b. Thus, the insulating layer 212a is formed.

The insulating film serving as the insulating layer 212a can be formed to have a single-layer structure or a stacked-layer structure using a film including an inorganic insulating material such as silicon oxide, silicon oxynitride, silicon nitride oxide, silicon nitride, aluminum oxide, hafnium oxide, or tantalum oxide. Alternatively, the insulating film serving as the insulating layer 212a can be formed using an organic insulating material such as a polyimide or an acrylic resin as long as it can withstand heat treatment in a later step.

FIGS. 6A and 6B are a schematic top view and a schematic cross-sectional view at this stage.

Next, a semiconductor film serving as the semiconductor layer 125 is formed over the gate electrode layer 111a, the gate electrode layer 111b, and the insulating layer 212a. In consideration of a reduction in thickness in a later planarization step, here, the thickness of the semiconductor film is preferably larger than the desired channel length.

Although a semiconductor material such as silicon can be used as a material of the semiconductor film, a semiconductor material whose band gap is wider than that of silicon is preferably used. A compound semiconductor is an example of the semiconductor whose band gap is wider than that of silicon. Examples of the compound semiconductor include an oxide semiconductor, a nitride semiconductor, and the like.

The off-state resistance of a transistor is inversely proportional to the concentration of carriers thermally excited in a semiconductor layer in which a channel is formed. Since the band gap of silicon is 1.1 eV even in the absence of carrier caused by a donor or an acceptor (i.e., even in the case of an intrinsic semiconductor), the concentration of thermally excited carriers at room temperature (300 K) is approximately $1 \times 10^{11}$ cm$^{-3}$.

On the other hand, for example, in the case of a semiconductor whose band gap is 3.2 eV, the concentration of thermally excited carriers is approximately $1 \times 10^{-7}$ cm$^{-3}$. When the electron mobility is the same, the resistivity is inversely proportional to the carrier concentration, and thus the resistivity of the semiconductor having a band gap of 3.2 eV is higher by 18 digits than that of silicon.

The off-state current of a transistor including such a semiconductor having a wide band gap can be extremely small. When such a transistor is used as each of the transistor 102a and the transistor 102b, a potential held in a holding node of each memory element can be held for an extremely long time.

In this embodiment, as the semiconductor film, an oxide semiconductor film is formed by a sputtering method, specifically, by a sputtering method with the use of an In—Ga—Zn-based oxide semiconductor target.

Note that the material which can be used for the oxide semiconductor film is not limited to the above. An oxide semiconductor preferably contains at least indium (In) or zinc (Zn). In particular, In and Zn are preferably contained.

As a stabilizer for reducing variation in electric characteristics of a transistor including the oxide semiconductor, it is preferable that one or more elements selected from gallium (Ga), tin (Sn), hafnium (Hf), aluminum (Al), and lanthanoid be contained.

As lanthanoid, there are lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

For example, indium oxide, tin oxide, zinc oxide, or the like can be used as the oxide semiconductor.

As the oxide semiconductor, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, or the like can be used.

As the oxide semiconductor, an In—Ga—Zn-based oxide (also referred to as IGZO), an In—Sn—Zn-based oxide, a Sn—Ga—Zn-based oxide, an In—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an Al—Ga—Zn-based oxide, a Sn—Al—Zn-based oxide, or the like can be used.

As the oxide semiconductor, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, an In—Hf—Al—Zn-based oxide, or the like can be used.

Note that here, for example, an "In—Ga—Zn-based oxide" means an oxide containing In, Ga, and Zn as its main component and there is no particular limitation on the ratio of In:Ga:Zn. The In—Ga—Zn-based oxide may contain another metal element in addition to In, Ga, and Zn.

Alternatively, the oxide semiconductor film can be formed using an oxide semiconductor obtained by adding $SiO_2$ to any of the above metal oxides.

Moreover, the oxide semiconductor film can be formed using an oxide semiconductor represented by $InMO_3(ZnO)_m$ (m>0). Here, M represents one or more metal elements selected from Ga, Al, Mn, and Co.

For example, it is possible to use an In—Ga—Zn-based oxide with an atomic ratio of In:Ga:Zn=1:1:1 or In:Ga:Zn=2:2:1, or an oxide with an atomic ratio close to the above atomic ratios.

Alternatively, an In—Sn—Zn-based oxide with an atomic ratio of In:Sn:Zn=1:1:1, In:Sn:Zn=2:1:3, or In:Sn:Zn=2:1:5, or an oxide with an atomic ratio close to the above atomic ratios may be used.

However, the oxide semiconductor is not limited to the above, and a material with an appropriate composition may be used depending on needed semiconductor characteristics (e.g., mobility, threshold voltage, and their variation). In order to obtain the needed semiconductor characteristics, it is preferable that the carrier concentration, the impurity concentration, the defect density, the atomic ratio between a metal element and oxygen, the interatomic distance, the density, and the like be set to appropriate values.

For example, high mobility can be obtained relatively easily in the case of using an In—Sn—Zn-based oxide. However, mobility can be increased by reducing the defect density in a bulk also in the case of using an In—Ga—Zn-based oxide.

Note that for example, the expression "the composition of an oxide with an atomic ratio of In:Ga:Zn=a:b:c (a+b+c=1) is in the neighborhood of the composition of an oxide with an atomic ratio of In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

The oxide semiconductor may be either single crystal or non-single-crystal. In the case where the oxide semiconductor is non-single-crystal, the oxide semiconductor may be either amorphous or polycrystalline. Further, the oxide semiconductor may have a structure including a crystalline portion in an amorphous portion. Note that the amorphous structure has many defects; therefore, a non-amorphous structure is preferred.

In an oxide semiconductor in an amorphous state, a flat surface can be obtained with relative ease, so that when a transistor is manufactured with the use of the oxide semiconductor, interface scattering can be reduced, and relatively high mobility can be obtained with relative ease.

In an oxide semiconductor having crystallinity, defects in the bulk can be further reduced and when a surface flatness is improved, mobility higher than that of an oxide semiconductor in an amorphous state can be obtained.

Here, it is preferable that the oxide semiconductor film be formed so as to contain impurities such as alkali metal, a hydrogen atom, a hydrogen molecule, water, a hydroxyl group, or a hydride as little as possible, for example, in such a manner that the impurities are prevented from being mixed into a sputtering target and a gas used for deposition. In addition, when a deposition apparatus is sufficiently evacuated during the deposition and the oxide semiconductor film is deposited while the substrate is heated, the concentration of impurities included in the deposited oxide semiconductor film can be lowered.

After formation of the oxide semiconductor film, it is preferable that dehydration treatment (dehydrogenation treatment) be performed to remove hydrogen or moisture from the oxide semiconductor film so that the oxide semiconductor film is highly purified to contain impurities as little as possible, and that oxygen be added to the oxide semiconductor film to fill oxygen vacancies increased by the dehydration treatment (dehydrogenation treatment). The oxygen can be supplied by a method in which heat treatment is performed under an oxygen atmosphere, by a method in which the oxide semiconductor film is provided in the vicinity of a film releasing oxygen by heating and heat treatment is performed, or the like. In this specification and the like, supplying oxygen to an oxide semiconductor film may be expressed as oxygen adding treatment, and treatment for making the oxygen content of an oxide semiconductor film be in excess of that in the stoichiometric composition may be expressed as treatment for making an oxygen-excess state.

In this manner, hydrogen or moisture is removed from the oxide semiconductor film by dehydration treatment (dehydrogenation treatment) and oxygen vacancies therein are filled by oxygen adding treatment, whereby the oxide semiconductor film can be turned into an i-type (intrinsic) or substantially i-type oxide semiconductor film. The oxide semiconductor film formed in such a manner includes extremely few (close to zero) carriers derived from a donor, and the carrier concentration thereof is lower than $1\times10^{14}$/cm$^3$, preferably lower than $1\times10^{12}$/cm$^3$, further preferably lower than $1\times10^{11}$/cm$^3$, still further preferably lower than $1.45\times10^{10}$/cm$^3$.

The transistor including the oxide semiconductor layer which is highly purified by sufficiently reducing the hydrogen concentration, and in which defect levels in the energy gap due to oxygen vacancies are reduced by sufficiently supplying oxygen can achieve excellent off-state current characteristics. For example, the off-state current (per unit channel width (1 μm) here) at room temperature (25° C.) is 100 zA (1 zA (zeptoampere) is $1\times10^{-21}$ A) or smaller, preferably 10 zA or smaller. The off-state current at 85° C. is 100 zA ($1\times10^{19}$ A) or smaller, preferably 10 zA ($1\times10^{-20}$ A) or smaller. In this manner, the transistor which has extremely favorable off-state current characteristics can be obtained with the use of an i-type (intrinsic) or substantially i-type oxide semiconductor layer.

Next, an unnecessary portion of the semiconductor film is etched, so that the semiconductor layer 125 and the dielectric layer 134 are formed.

The semiconductor film is preferably etched using a hard mask. First, an inorganic film serving as a hard mask is formed over the semiconductor film, and then a resist is formed over the inorganic film to overlap with regions for forming the semiconductor layer 125 and the dielectric layer 134. Here, so-called sliming treatment is preferably performed. In the sliming treatment, aching is performed on the formed resist to reduce the width of the resist. The widths of the semiconductor layer 125 and the dielectric layer 134 can be made smaller than the minimum feature size F by the sliming treatment. Accordingly, even in the case where the gate electrode layer 111a and the gate electrode layer 111b are formed to have the widths of the minimum feature size F, the semiconductor layer 125 and the dielectric layer 134 can be formed within the regions of the gate electrode layer 111a and the gate electrode layer 111b.

The hard mask is formed in such manner that a region of the inorganic film, which is not covered with the resist, is etched. The resist may be removed after the formation of the hard mask.

In etching of the semiconductor film, a region of the semiconductor film, which is not covered with the hard mask, is etched by a highly anisotropic etching method. Here, the etching is performed under the condition that the layers provided below the semiconductor film are not etched. Thus, the semiconductor layer 125 having a columnar shape (including a cylindrical shape and a polygonal prismatic shape) can be formed.

Then, the hard mask is removed. In the case where the resist over the hard mask is not removed, the resist is removed and then the hard mask is removed.

Next, an insulating film covering a side surface and an upper surface of the semiconductor layer 125 is formed. Part of the insulating film serves as the gate insulating layer 124. Therefore, the insulating film is preferably formed such that a portion in contact with the side surface of the semiconductor layer 125 has uniform thickness. The insulating film can be formed by a deposition method such as a CVD method or a sputtering method. It is preferable that the amount of impurities containing hydrogen atoms, such as water, hydrogen, and a hydride, be sufficiently small in the insulating film and at the interface between the insulating film and the semiconductor layer 125.

As the method for forming the insulating film, a high-density plasma CVD method using microwaves (e.g., with a frequency of 2.45 GHz) is preferably employed because a high-quality insulating film which is dense and has high breakdown voltage can be formed. When the highly purified oxide semiconductor is in contact with the high-quality gate insulating layer, the interface state can be reduced and interface characteristics can be favorable.

The insulating film can be a single layer or a stack of layers containing any of silicon oxide, silicon nitride oxide, silicon oxynitride, silicon nitride, hafnium oxide, aluminum oxide, tantalum oxide, yttrium oxide, hafnium silicate (Hf-$Si_xO_y$ (x>0, y>0)), hafnium silicate to which nitrogen is added ($HfSi_3O_yN_z$ (x>0, y>0, z>0)), hafnium aluminate to which nitrogen is added ($HfAl_xO_yN_z$ (x>0, y>0, z>0)), and the like, for example.

Figure 7A:
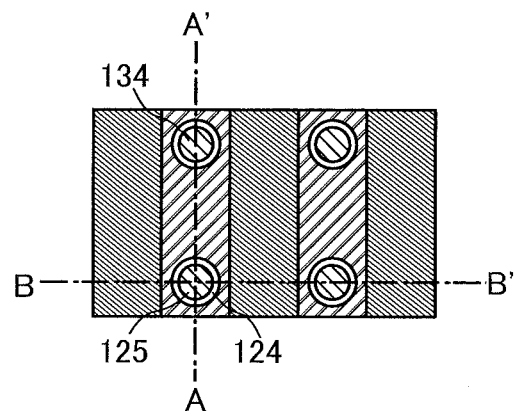
FIGS. 7A and 7B illustrate an example of a process of manufacturing a semiconductor device according to an embodiment of the present invention.
Figure 7B:
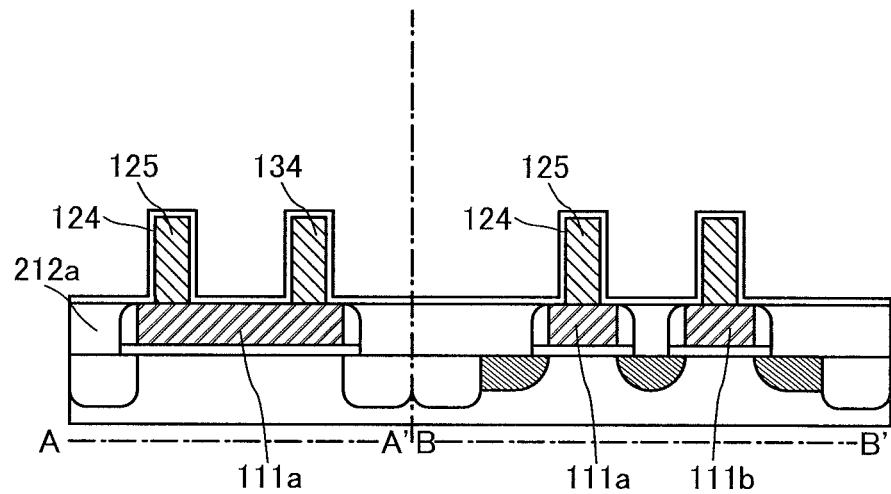

FIGS. 7A and 7B are a schematic top view and a schematic cross-sectional view at this stage.

Next, a conductive film serving as the wiring layer 201 is formed over the insulating film serving as the gate insulating layer 124 and an unnecessary portion of the conductive film is etched. After that, an insulating film serving as the insulating layer 212b is formed over the insulating film and the conductive film. Then, planarization treatment is performed to expose the upper surfaces of the semiconductor layer 125 and the dielectric layer 134, whereby the wiring layer 201 and the insulating layer 212b are formed.

The conductive film serving as the wiring layer 201 can be formed using a material and a method similar to those of the conductive film used as the gate electrode layer 111a and the gate electrode layer 111b. Note that the same applies to conductive films used as the wiring layer 202, the wiring layer 203a, the wiring layer 203b, and the wiring layer 204.

The insulating film serving as the insulating layer 212b can be formed using a material and a method similar to those of the insulating film used as the insulating layer 212a. Note that the same applies to insulating films used as the insulating layer 212c, the insulating layer 212d, the insulating layer 212e, the insulating layer 212f, the insulating layer 212g, and the insulating layer 212h.

Next, an insulating film serving as the insulating layer 212c is formed over and in contact with the semiconductor layer 125, the dielectric layer 134, the gate insulating layer 124, the wiring layer 201, and the insulating layer 212b. After that, opening portions reaching the semiconductor layer 125 and the dielectric layer 134 are formed in the insulating film serving as the insulating layer 212c, so that the insulating layer 212c is formed.

Next, a conductive film serving as the wiring layer 202 and the electrode layer 122 is formed over the semiconductor layer 125, the dielectric layer 134, and the insulating layer 212c. After that, an unnecessary portion of the conductive film is etched, so that the wiring layer 202 and the electrode layer 122 are formed.

Through the above steps, the transistor 102a and the capacitor 103a can be formed over the gate electrode layer 111a of the transistor 101a. At the same time, the transistor 102b and the capacitor 103b are formed over the gate electrode layer 111b of the transistor 101b.

Figure 8A:
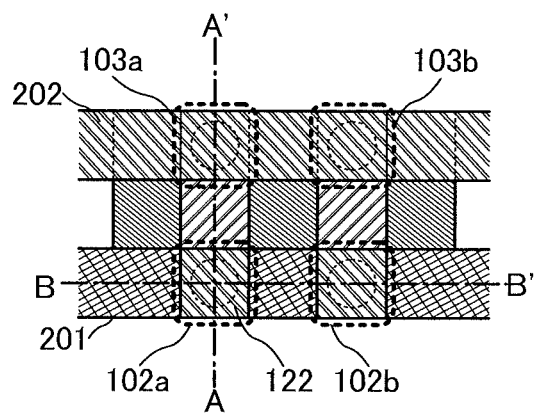
FIGS. 8A and 8B illustrate an example of a process of manufacturing a semiconductor device according to an embodiment of the present invention.
Figure 8B:
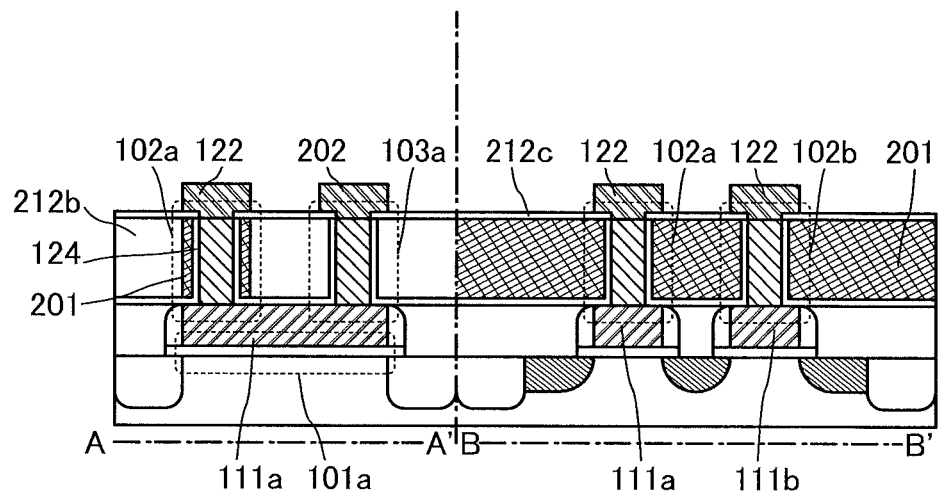

FIGS. 8A and 8B are a schematic top view and a schematic cross-sectional view at this stage.

Next, an insulating film serving as the insulating layer 212d is formed over the wiring layer 202, the electrode layer 122, and the insulating layer 212c. After that, planarization treatment is performed to expose upper surfaces of the wiring layer 202 and the electrode layer 122, so that the insulating layer 212d is formed.

Next, an insulating film serving as the insulating layer 212e is formed, so that the insulating layer 212e is formed.

Then, an opening portion reaching the electrode layer 122 is formed in the insulating layer 212e. After that, a conductive film serving as the connection electrode layer 213a is formed over the insulating layer 212e and the electrode layer 122 and planarization treatment is performed to expose an upper surface of the insulating layer 212e. Thus, the connection electrode layer 213a electrically connected to the electrode layer 122 is formed.

At the same time, an opening portion reaching the first electrode layer 112a or the first electrode layer 112b is formed in the insulating layer 212e, the insulating layer 212d, the insulating layer 212c, the insulating layer 212b, the insulating film serving as the gate insulating layer 124, and the insulating layer 212a. Then, the connection electrode layer 213c electrically connected to the first electrode layer 112a or the first electrode layer 112b is formed (see FIGS. 4A to 4C).

Next, a conductive film serving as the wiring layer 203a and the wiring layer 203b is formed over the insulating layer 212e, the connection electrode layer 213a, and the connection electrode layer 213c and an unnecessary portion of the conductive film is etched. Thus, the wiring layer 203a and the wiring layer 203b are formed.

After that, an insulating film serving as the insulating layer 212f is formed over the insulating layer 212e, the wiring layer 203a, and the wiring layer 203b and planarization treatment is performed to expose upper surfaces of the wiring layer 203a and the wiring layer 203b. Thus, the insulating layer 212f is formed.

Next, an insulating film serving as the insulating layer 212g is formed over the insulating layer 212f, the wiring layer 203a, and the wiring layer 203b, so that the insulating layer 212g is formed.

Next, an opening portion (not illustrated) reaching the second electrode layer 113 is formed in the insulating layer 212g, the insulating layer 212f, the insulating layer 212e, the insulating layer 212d, the insulating layer 212c, the insulating layer 212b, the insulating film serving as the gate insulating layer 124, and the insulating layer 212a. After that, a conductive film serving as the connection electrode layer 213b is formed over the insulating layer 212g and the second electrode layer 113 and planarization treatment is performed to expose an upper surface of the insulating layer 212g. Thus, the connection electrode layer 213b (not illustrated) electrically connected to the second electrode layer 113 is formed (see FIG. 4C).

Next, a conductive film serving as the wiring layer 204 is formed over the insulating layer 212g and the connection electrode layer 213b (not illustrated), and an unnecessary portion of the conductive film is etched. Thus, the wiring layer 204 is formed (see FIG. 4C).

After that, the insulating layer 212h covering the insulating layer 212g and the wiring layer 204 may be formed. The insulating layer 212h may be formed in such a manner that an insulating film serving as the insulating layer 212h is formed and then an upper surface of the insulating film is planarized by planarization treatment.

Figure 9A:
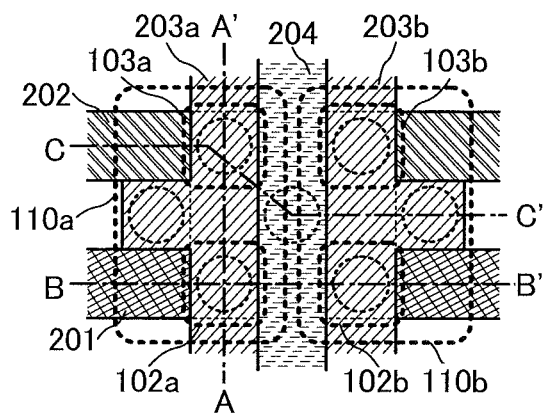
FIGS. 9A and 9B illustrate an example of a process of manufacturing a semiconductor device according to an embodiment of the present invention.
Figure 9B:
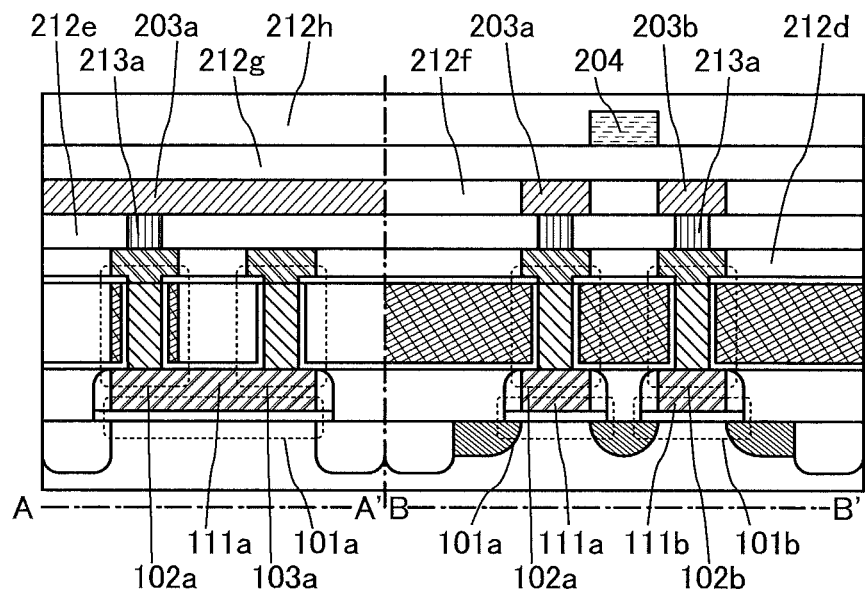

FIGS. 9A and 9B are a schematic top view and a schematic cross-sectional view at this stage.

Through the above steps, the memory device including the memory element 110a and the memory element 110b described in the structure example of this embodiment can be manufactured.

The method in which the semiconductor layer 125 and the dielectric layer 134 are formed with the use of the hard mask is described above; however, the semiconductor layer 125 and the dielectric layer 134 can be formed by another method. A manufacturing method different from the above method is described below with reference to FIGS. 10A to 10D.

First, the transistor 101a and the insulating layer 212a are formed in the above-described manner.

Next, an insulating layer 212i and a conductive film serving as the wiring layer 201 are stacked over the insulating layer 212a and the gate electrode layer 111a. Here, the insulating layer 212i is formed to electrically isolate the gate electrode layer 111a from the wiring layer 201.

Figure 10A:
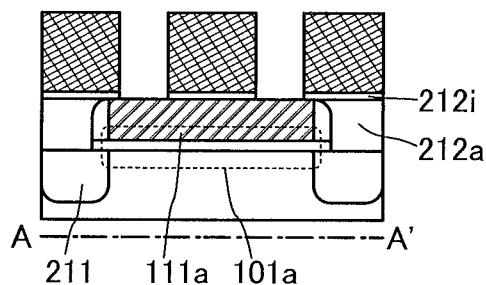
FIGS. 10A to 10D illustrate an example of a process of manufacturing a semiconductor device according to an embodiment of the present invention.

Next, opening portions reaching the gate electrode layer 111a are formed in the conductive film and the insulating layer 212i. FIG. 10A is a schematic cross-sectional view at this stage.

Next, an insulating film serving as the gate insulating layer 124 is formed in contact with side surfaces and bottom surfaces of the opening portions. Alternatively, an upper surface and a side surface of the conductive film may be oxidized to form an insulating film.

After that, highly anisotropic etching treatment is performed on the insulating film, whereby the upper surfaces of the conductive film and the gate electrode layer 111a are exposed and the insulating film remains only on sidewalls of the opening portions. In this manner, the gate insulating layer 124 in contact with the sidewalls of the opening portions can be formed.

Figure 10B:
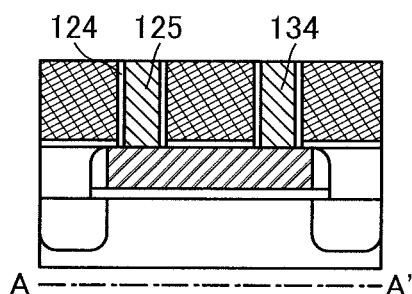

Next, over the conductive film and the gate electrode layer 111a, a semiconductor film serving as the semiconductor layer 125 and the dielectric layer 134 is formed in contact with the gate insulating layer 124. After that, planarization treatment is performed to expose an upper surface of the conductive film. Thus, the semiconductor layer 125 and the dielectric layer 134 are formed in the opening portions. FIG. 10B is a schematic cross-sectional view at this stage.

Next, a resist is formed over the upper surfaces of the conductive film, the gate insulating layer 124, the semiconductor layer 125, and the dielectric layer 134, and an unnecessary portion of the conductive film is etched. Thus, the wiring layer 201 is formed.

Figure 10C:
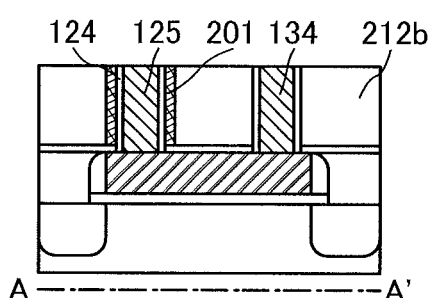

After that, an insulating film serving as the insulating layer 212b is formed and planarization treatment is performed to expose upper surfaces of the wiring layer 201, the semiconductor layer 125, the dielectric layer 134, and the gate insulating layer 124. Thus, the insulating layer 212b is formed. FIG. 10C is a schematic cross-sectional view at this stage.

Figure 10D:
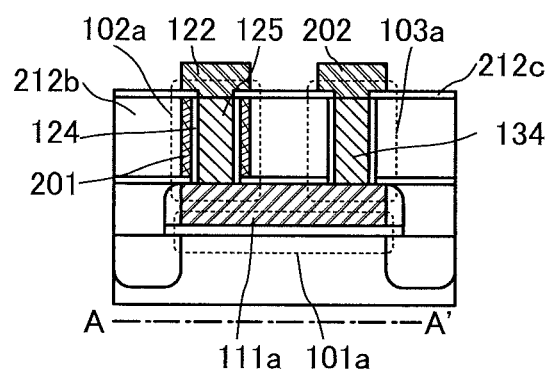

After that, in the above-described manner, the insulating layer 212c, the electrode layer 122, and the wiring layer 202 are formed. FIG. 10D is a schematic cross-sectional view at this stage.

Through the above steps, the transistor 102a and the capacitor 103a can be formed over the transistor 101a.

In this manner, the semiconductor layer 125 and the dielectric layer 134 can be surely formed within the region of the gate electrode layer 111a without sliming treatment.

The above is the description of the example of this manufacturing process.

Modification Example

An example of a method for manufacturing the memory device including a thin film of an insulating material as a dielectric layer of a capacitor, which is illustrated in FIG. 5, will be described below with reference to drawings. Note that description of the same portions as those in the above example of the manufacturing process is omitted.

Figure 11A:
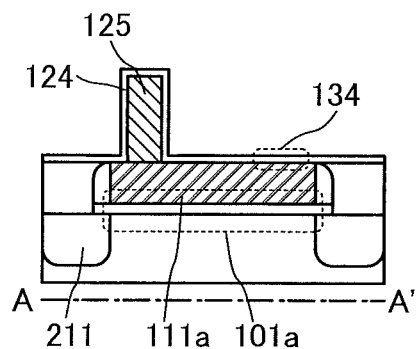
FIGS. 11A to 11C illustrate an example of a process of manufacturing a semiconductor device according to an embodiment of the present invention.
Figure 11B:
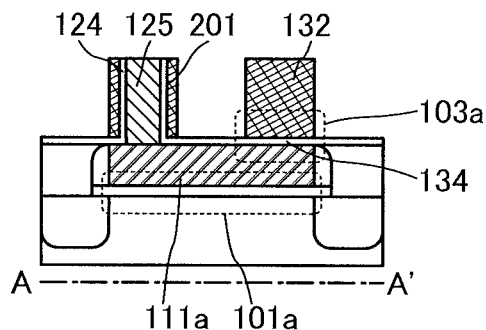
Figure 11C:
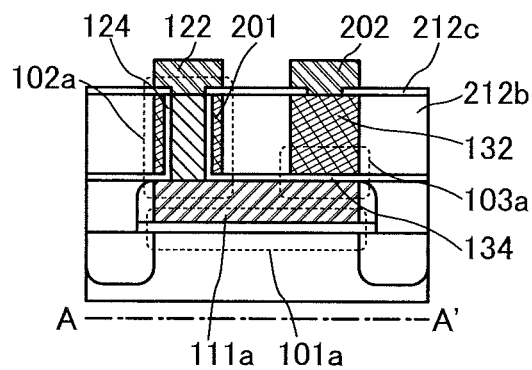

FIGS. 11A to 11C are schematic cross-sectional views at respective stages of this modification example.

First, by the method described in the above example of the manufacturing process, the transistor 101a is formed.

Then, the semiconductor layer 125 is formed over the gate electrode layer 111a. Although the dielectric layer 134 is formed using the same material as the semiconductor layer 125 at the same time in the above structure example, the dielectric layer 134 is not formed at this step in this modification example.

Next, an insulating film serving as the gate insulating layer 124 is formed. Part of the insulating film can be used as the dielectric layer 134. FIG. 11A is a schematic cross-sectional view at this stage.

Next, in the step of forming the wiring layer 201, an island-shaped pattern formed using the same conductive film as the wiring layer 201 is formed in a region where the capacitor 103a is formed, so that the electrode layer 132 is formed. In this manner, the capacitor 103a in which the dielectric layer 134 formed using the insulating film is sandwiched between the gate electrode layer 111a and the electrode layer 132 is formed. FIG. 11B is a schematic cross-sectional view at this stage.

Next, the insulating layer 212b and the insulating layer 212c are formed. After that, an opening portion reaching the semiconductor layer 125 is formed in the insulating layer 212c, and at the same time, an opening portion reaching the electrode layer 132 is formed.

Next, the electrode layer 122 and the wiring layer 202 are formed. The wiring layer 202 is electrically connected to the electrode layer 132 through the opening portion provided in the insulating layer 212c. FIG. 11C is a schematic cross-sectional view at this stage.

The following steps are performed in accordance with the above example of the manufacturing process. Thus, a memory device including the capacitor 103 including an insulating film as the dielectric layer 134 can be manufactured.

In this method, a capacitor can be manufactured concurrently with a vertical transistor without an increase in the number of photomasks and the number of manufacturing steps. Therefore, a memory device can be manufactured at low cost with high yield.

The above is the description of this modification example.

This embodiment can be combined with any of the other embodiments disclosed in this specification as appropriate.

Embodiment 3

In this embodiment, as an example of a semiconductor device of an embodiment of the present invention, an example of a structure of a memory device which is different from the memory devices of the above embodiments will be described with reference to drawings. Note that description of the same portions as those in the above embodiments is omitted or simplified.

Figure 12A:
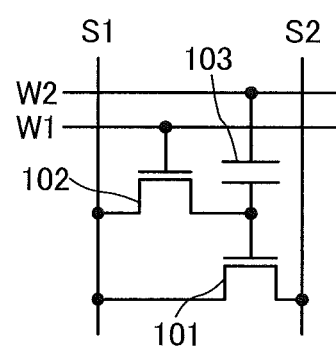
FIGS. 12A to 12C illustrate a semiconductor device according to an embodiment of the present invention.

FIG. 12A is a circuit diagram of a main portion of the memory device described in this embodiment.

The memory device includes the transistor 101, the transistor 102, and the capacitor 103.

In the memory device, the wiring S1 is electrically connected to the first electrodes of the transistor 101 and the transistor 102, the wiring S2 is electrically connected to the second electrode of the transistor 101, the wiring W1 is connected to the gate of the transistor 102, and the wiring W2 is electrically connected to one electrode of the capacitor 103.

Figure 12B:
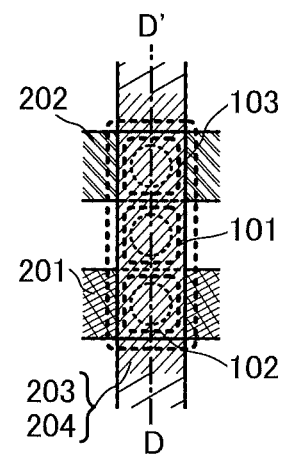
Figure 12C:
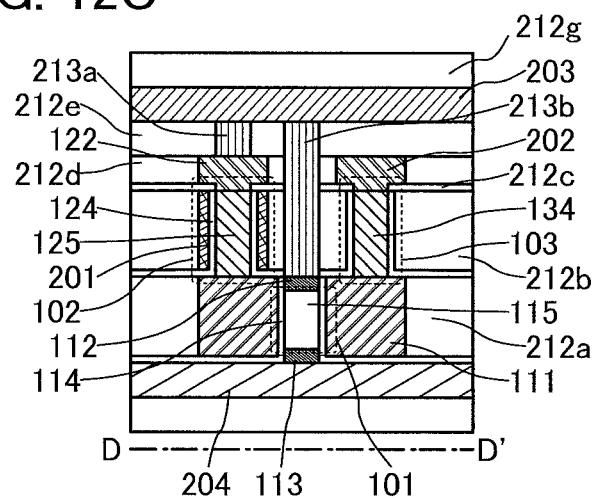

FIG. 12B is a schematic top view of the memory device described as an example in this embodiment. FIG. 12C is a schematic cross-sectional view taken along line D-D' in FIG. 12B.

The memory device illustrated in FIGS. 12B and 12C has a structure in which a vertical transistor is used as the transistor 101 in the memory device described as an example in Embodiment 2.

The memory device includes the wiring layer 204 provided over an insulating surface, the transistor 101 which is provided over the wiring layer 204 and is a vertical transistor, the transistor 102 and the capacitor 103 provided over the gate electrode layer 111 of the transistor 101, the wiring layer 201 serving as the gate electrode of the transistor 102, the wiring layer 202 serving as the one electrode of the capacitor 103, and the wiring layer 203 which is provided over the transistor 101 and the capacitor 103 and electrically connected to the transistor 101 and the transistor 102.

The wiring layer 201 serves as the wiring W1 in FIG. 12A. The wiring layer 202 serves as the wiring W2. The wiring layer 203 serves as the wiring S1. The wiring layer 204 serves as the wiring S2. Further, the gate electrode layer 111 corresponds to the holding node.

As illustrated in FIGS. 12B and 12C, the wiring layer 204 can be provided below the transistor 101, so that the wiring layer 204 and the wiring layer 203 can be provided to overlap with each other. In this case, the wiring layer 204 and the wiring layer 203 are formed with a layer including the transistor 101 and a layer including the transistor 102 and the capacitor 103 provided therebetween; therefore, the wiring layer 204 and the wiring layer 203 can be sufficiently distanced from each other. Accordingly, the capacitance between the wirings can be negligible. Two wiring layers are formed to overlap with each other in this manner, whereby the area of the memory device can be extremely small.

Further, in FIG. 12C, the gate electrode layer 111 and the wiring layer 204 are electrically isolated from each other by the insulating film used as the gate insulating layer 114; however, another insulating layer may be formed between the gate electrode layer 111 and the wiring layer 204 to reduce capacitance therebetween. In this case, the wiring layer 204 and the second electrode layer 113 may be connected to each other through a connection electrode layer in the insulating layer.

The transistor 101 includes the second electrode layer 113 which is provided over the wiring layer 204 and electrically connected to the wiring layer 204, the semiconductor layer 115 which is provided over the second electrode layer 113 and electrically connected to the second electrode layer 113, the first electrode layer 112 which is provided over the semiconductor layer 115 and electrically connected to the semiconductor layer 115, the gate insulating layer 114 provided in contact with side surfaces of the semiconductor layer 115, the first electrode layer 112, and the second electrode layer 113, and the gate electrode layer 111 provided to face at least the side surface of the semiconductor layer 115. The channel direction is perpendicular to the insulating surface.

An amorphous semiconductor, a polycrystalline semiconductor, a single crystal semiconductor, or the like can be used for the semiconductor layer 115.

As an amorphous semiconductor, hydrogenated amorphous silicon can be typically given. As a polycrystalline semiconductor, polysilicon (polycrystalline silicon) can be typically given. Examples of polysilicon include so-called high-temperature polysilicon that contains polysilicon as a main component and is formed at a process temperature higher than or equal to 800° C., so-called low-temperature polysilicon that contains polysilicon as a main component and is formed at a process temperature lower than or equal to 600° C., polysilicon obtained by crystallizing amorphous silicon by using an element that promotes crystallization or the like, and the like. It is needless to say that a microcrystalline semiconductor or a semiconductor partially including a crystalline phase can also be used.

Any of the above oxide semiconductors may be used as the semiconductor included in the semiconductor layer 115. In this case, the first electrode layer 112 and the second electrode layer 113 are not necessarily provided.

The method for manufacturing the transistor 102 can be employed in the manufacture of the transistor 101. In this case, the transistor 101 can be formed using, instead of a single film of the semiconductor used as the semiconductor layer 125, a stacked film including a semiconductor film to which an impurity included in the second electrode layer 113 is added, a semiconductor film used as the semiconductor layer 115, and a semiconductor film to which an impurity included in the first electrode layer 112 is added.

The transistor 102 and the capacitor 103 can have the structures described in the above embodiments.

Thus, when the transistor 101 is a vertical transistor, the transistor 101 can be formed within a region having an area of $F^2$. In addition, the transistor 102 and the capacitor 103 can each be formed within a region having an area of $F^2$. Therefore, even in the case of high integration, a memory device whose area is extremely reduced can be achieved.

This embodiment can be combined with any of the other embodiments disclosed in this specification as appropriate.

Embodiment 4

In this embodiment, as an example of a semiconductor device of an embodiment of the present invention, an example of a structure of a memory device which is different from the memory devices in the above embodiments will be described with reference to drawings. Note that description of the same portions as those in the above embodiments is omitted or simplified.

When the memory device of an embodiment of the present invention includes a plurality of layers of memory devices each including the first transistor 101, the second transistor 102, and the capacitor 103 (the layer can also be referred to as a layer of a semiconductor device, and hereinafter is referred to as a memory layer), the memory device can be highly integrated. Further, a driver circuit can be provided below the memory layer. An example of a structure in which memory layers are stacked and an example of a structure in which a driver circuit is provided below a memory layer will be described below.

Structure Example 1

Figure 13:
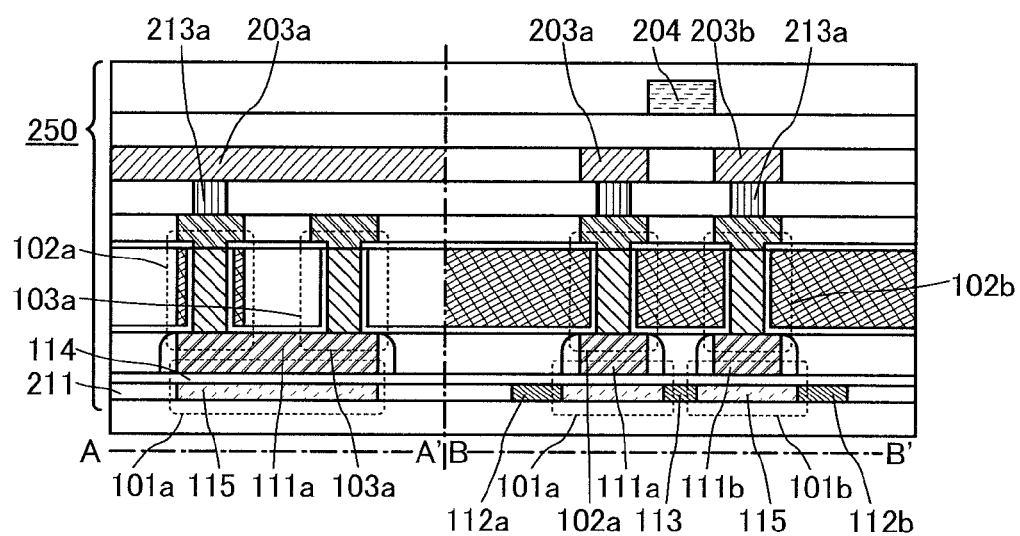
FIG. 13 illustrates a semiconductor device according to an embodiment of the present invention.

FIG. 3B is used for a top view of a memory device described in this structure example, and FIG. 13 corresponds to a schematic cross-sectional view taken along line A-A' and line B-B'.

The memory device of this embodiment is different from the memory device in Embodiment 2 (e.g., FIGS. 4A and 4B) in that it is formed over an insulating surface. In addition, the structures of the transistor 101a and the transistor 101b of this embodiment is different from those in Embodiment 2.

The transistor 101a includes the semiconductor layer 115 formed over an insulating surface, the first electrode layer 112a and the second electrode layer 113 which are provided so as to be in contact with side surfaces of the semiconductor layer 115 and electrically connected to the semiconductor layer 115, the gate insulating layer 114 provided in contact with an upper surface of the semiconductor layer 115, and the gate electrode layer 111a provided in contact with an upper surface of the gate insulating layer 114.

Similarly, the transistor 101b includes the semiconductor layer 115, the first electrode layer 112b, the second electrode layer 113, the gate insulating layer 114, and the gate electrode layer 111b.

The element separation layer 211 is provided in contact with side surfaces of the semiconductor layer 115, the first electrode layer 112a, the first electrode layer 112b, and the second electrode layer 113.

Any of the semiconductors mentioned in Embodiment 3 can be used as the semiconductor included in the semiconductor layer 115.

A single crystal semiconductor to which a method for forming an SOI substrate is applied is preferably used as the semiconductor included in the semiconductor layer 115.

An SOI substrate can be formed by the following method or the like: after oxygen ions are implanted in a mirror-polished wafer, the wafer is heated at high temperature to form an oxidized layer at a predetermined depth from a surface of the wafer and eliminate defects generated in a surface layer. Alternatively, an SOI substrate can be formed by a method in which a semiconductor substrate is separated by utilizing the growth of microvoids formed by hydrogen ion irradiation (this growth is caused by heat treatment). Alternatively, an SOI substrate can be formed by a method in which a single crystal semiconductor layer is formed on an insulating surface by crystal growth.

The transistor 102a and the capacitor 103a are provided over the gate electrode layer 111a. Further, the transistor 102b and the capacitor 103b (not illustrated) are provided over the gate electrode layer 111b.

Here, a plurality of layers forming at least the transistor 101a, the transistor 102a, and the capacitor 103a is correctively referred to as a memory layer 250. The memory layer 250 preferably includes a plurality of memory devices arranged over a surface where the memory layer 250 is formed. Further, the memory layer 250 includes wiring layers for electrically connecting the transistors and the capacitors.

Thus, a structure is employed in which the transistor 101a and the transistor 101b can be formed over an insulating surface, whereby a plurality of memory layers 250 can be stacked or a driver circuit can be provided below the memory layer 250.

Figure 14:
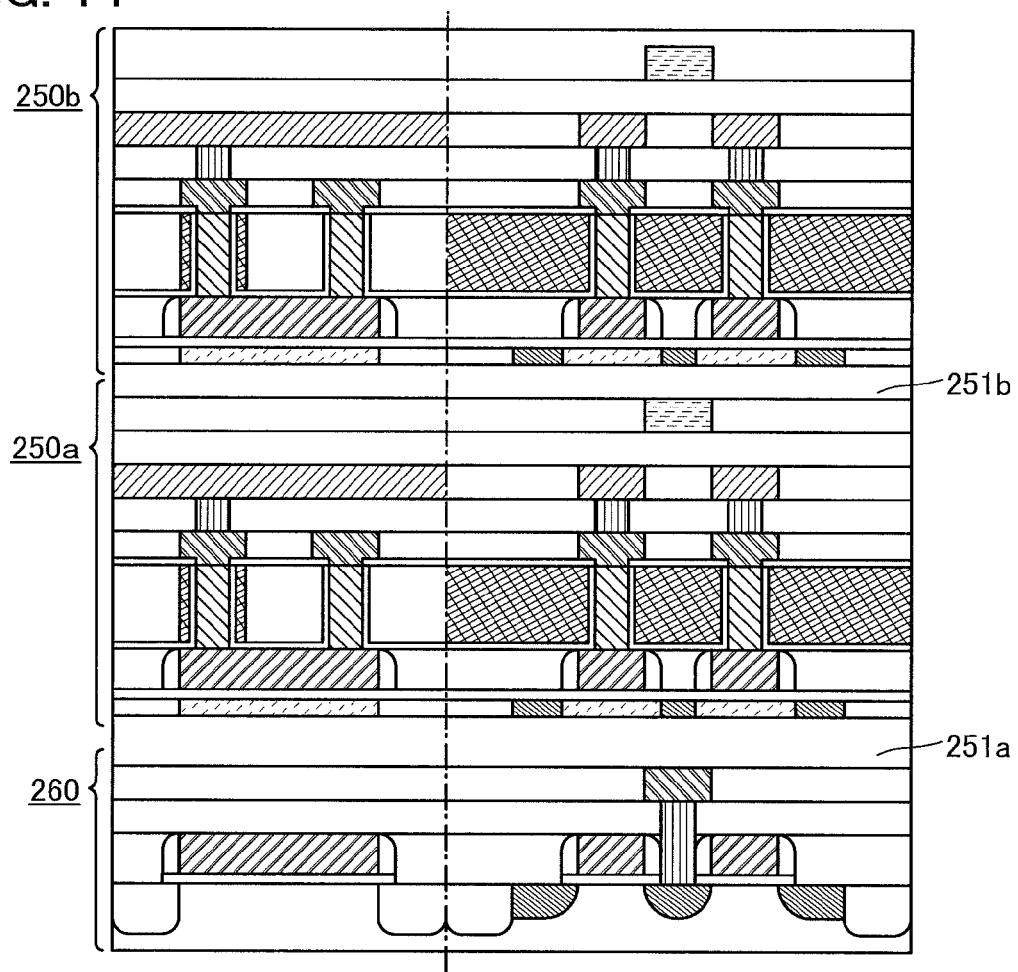
FIG. 14 illustrates a semiconductor device according to an embodiment of the present invention.

FIG. 14 illustrates a structure of a memory device in which a memory layer 250a and a memory layer 250b are stacked over a driver circuit portion 260 formed using a conventional CMOS process.

The memory layer 250a is provided over the driver circuit portion 260 with an interlayer insulating layer 251a provided therebetween. The memory layer 250b is provided over the memory layer 250a with an interlayer insulating layer 251b provided therebetween.

Surfaces of the interlayer insulating layer 251a and the interlayer insulating layer 251b are preferably planarized. Further, in order to reduce parasitic capacitance between the driver circuit portion 260 and the memory layer 250a and between the memory layer 250a and the memory layer 250b, the interlayer insulating layer 251a and the interlayer insulating layer 251b are preferably formed using a low-dielectric insulating material or preferably formed sufficiently thick.

Each wiring layer included in the memory layer 250a and the memory layer 250b is electrically connected to the driver circuit portion 260 through a connection electrode layer in a region not illustrated, and operation such as writing, erasing, and reading data is controlled by the driver circuit portion 260.

Thus, with a stack of a plurality of memory layers, the amount of data per area of a memory device can be increased. Further, even when a driver circuit is provided below a memory layer, an increase of area can be prevented.

The above is the description of this structure example.

Modification Example

Further, in the case of employing a vertical transistor as the transistor 101, which is described in Embodiment 3, a plurality of memory layers can be stacked and a driver circuit can be provided below a memory layer in a manner similar to that of the above structure example.

Figure 15:
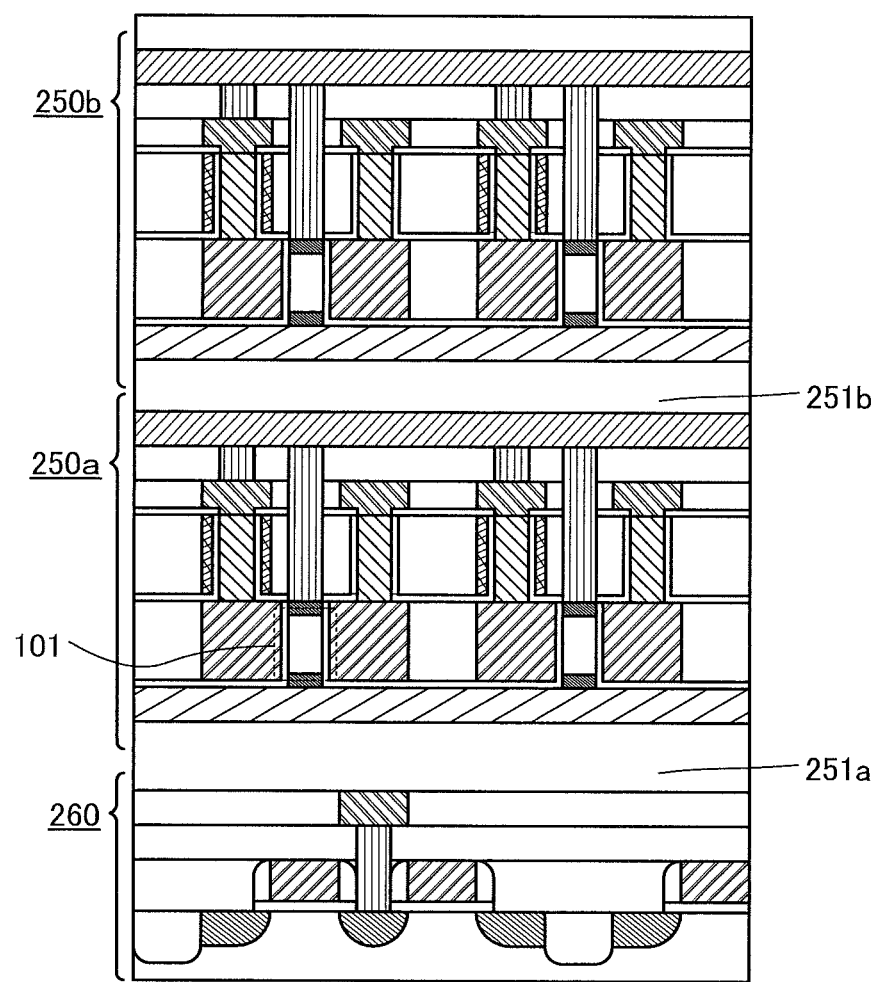
FIG. 15 illustrates a semiconductor device according to an embodiment of the present invention.

FIG. 15 illustrates an example of a structure of a memory device in which a vertical transistor is employed as the transistor 101.

Similarly to the above structure example, the memory layer 250a is provided over the driver circuit portion 260 with the interlayer insulating layer 251a provided therebetween. The memory layer 250b is provided over the memory layer 250a with the interlayer insulating layer 251b provided therebetween.

Here, the memory device whose area is extremely reduced, which is described in Embodiment 3, is employed for each of the memory layer 250a and the memory layer 250b. Accordingly, when a plurality of memory layers is stacked in this manner, the amount of data per unit area can be extremely large.

The above is the description of this modification example.

This embodiment can be combined with any of the other embodiments disclosed in this specification as appropriate.

Embodiment 5

When a crystalline semiconductor film is used as an oxide semiconductor film applicable to the semiconductor layer 125 in the above embodiments, electric characteristics of the transistor can be improved. As the semiconductor film, a c-axis aligned crystalline oxide semiconductor (CAAC-OS) film is preferably used. A semiconductor device including a CAAC-OS film will be described below.

The CAAC-OS film is not completely single crystal nor completely amorphous. The CAAC-OS film is an oxide semiconductor film with a crystal-amorphous mixed phase structure where crystalline portions and amorphous portions are included in an amorphous phase. Note that in most cases, the crystal portion fits inside a cube whose one side is less than 100 nm. From an observation image obtained with a transmission electron microscope (TEM), a boundary between an amorphous portion and a crystal portion in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal portions included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal portions, the directions of the a-axis and the b-axis of one crystal portion may be different from those of another crystal portion. In this specification, a simple term "perpendicular" includes a range from 85° to 95°. In addition, a simple term "parallel" includes a range from −5° to 5°.

In the CAAC-OS film, distribution of crystal portions is not necessarily uniform. For example, in the formation process of the CAAC-OS film, in the case where crystal growth occurs from a surface side of the oxide semiconductor film, the proportion of crystal portions in the vicinity of the surface of the oxide semiconductor film is higher than that in the vicinity of the surface where the oxide semiconductor film is formed in some cases. Further, when an impurity is added to the CAAC-OS film, the crystal portion in a region to which the impurity is added becomes amorphous in some cases.

Since the c-axes of the crystal portions included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal portion is the direction parallel to a normal vector of the surface where the CAAC-OS film is formed or a normal vector of the surface of the CAAC-OS film. The crystal portion is formed by deposition or by performing treatment for crystallization such as heat treatment after deposition.

With the use of the CAAC-OS film in a transistor, change in electric characteristics of the transistor due to irradiation with visible light or ultraviolet light is small. Thus, the transistor has high reliability.

Note that part of oxygen included in the oxide semiconductor film may be substituted with nitrogen.

In an oxide semiconductor having a crystal portion such as the CAAC-OS, defects in the bulk can be further reduced and when the surface flatness of the oxide semiconductor is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with the average surface roughness (Ra) of less than or equal to 1 nm, preferably less than or equal to 0.3 nm, more preferably less than or equal to 0.1 nm.

Note that Ra is obtained by expanding, into three dimensions, arithmetic mean surface roughness that is defined by JIS B 0601: 2001 (ISO4287:1997) so as to be able to apply it to a curved surface. Ra can be expressed as an "average value of the absolute values of deviations from a reference surface to a specific surface" and is defined by Formula 1.

[Formula 1]

$$Ra = \frac{1}{S_0} \int_{y_1}^{y_2} \int_{x_1}^{x_2} |f(x, y) - Z_0| dx dy \quad (1)$$

Here, the specific surface is a surface which is a target of roughness measurement, and is a quadrilateral region which is specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. $S_0$ represents the area of a rectangle which is obtained by projecting the specific surface on the xy plane, and $Z_0$ represents the height of the reference surface (the average height of the specific surface). Ra can be measured using an atomic force microscope (AFM).

The CAAC-OS film described above can be obtained in such a manner that, for example, an oxide semiconductor film is farmed while a substrate is heated (e.g., at a substrate temperature of 170° C.) to obtain c-axis alignment substantially perpendicular to a surface.

Note that the oxide semiconductor film may have a structure in which a plurality of oxide semiconductor films is stacked. In this case, a crystalline oxide semiconductor other than CAAC-OS may be used for one of a first oxide semiconductor film and a second oxide semiconductor film. In other words, CAAC-OS may be combined as appropriate with a single crystal oxide semiconductor, a polycrystalline oxide semiconductor, or an amorphous oxide semiconductor. When an amorphous oxide semiconductor is applied to at least either the first oxide semiconductor film or the second oxide semiconductor film, internal stress or external stress of the stacked oxide semiconductor films is relieved, variation in characteristics of a transistor is reduced, and reliability of the transistor can be further improved. On the other hand, an amorphous oxide semiconductor easily absorbs an impurity such as hydrogen, which serves as a donor, and oxygen deficiency is easily generated. Therefore, the amorphous oxide semiconductor is likely to be n-type.

Accordingly, a crystalline oxide semiconductor such as CAAC-OS is preferably used for an oxide semiconductor film on a channel side.

Further, the oxide semiconductor film may have a stacked-layer structure including three or more layers in which an amorphous oxide semiconductor film is interposed between a plurality of crystalline oxide semiconductor films. Furthermore, a structure in which a crystalline oxide semiconductor film and an amorphous oxide semiconductor film are alternately stacked may be employed. The above-described structures used when the oxide semiconductor film has a stacked structure of a plurality of layers can be employed in combination as appropriate.

As described above, a CAAC-OS film is used as the oxide semiconductor film, whereby hydrogen can be easily released from an upper surface of the CAAC-OS film by heat treatment (dehydrogenation treatment). Further, by the heat treatment, a large amount of hydrogen can be selectively released while the amount of oxygen released is reduced.

This embodiment can be combined with any of the other embodiments disclosed in this specification as appropriate.

Embodiment 6

In this embodiment, a central processing unit (CPU) at least part of which includes any of the memory devices described in the above embodiments will be described as an example of a semiconductor device.

Figure 16A:
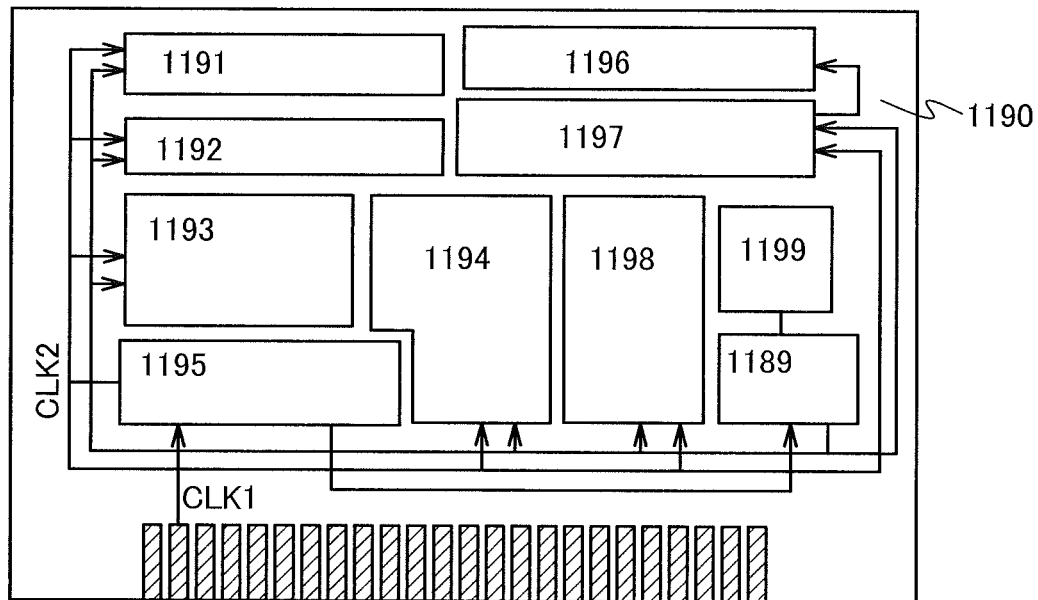
FIGS. 16A to 16C illustrate a semiconductor device according to an embodiment of the present invention.

FIG. 16A is a block diagram illustrating a specific structure of a CPU. The CPU illustrated in FIG. 16A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like can be used as the substrate 1190. The ROM 1199 and the ROM interface 1189 may each be provided over a separate chip. Obviously, the CPU illustrated in FIG. 16A is only an example in which the structure is simplified, and a variety of structures can be applied to an actual CPU depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 16A, a memory cell is provided in the register 1196 and so on. Any of the memory devices described in Embodiments 1 to 4 can be applied to the memory cell. The memory cell in the register 1196 includes both a logic element which inverts a logic level and any of the memory devices described in the above embodiments.

In the CPU illustrated in FIG. 16A, the register controller 1197 selects operation of holding data in the register 1196 in accordance with an instruction from the ALU 1191. That is, the register controller 1197 selects whether data is held by the logic element which inverts a logic level or the memory device in the memory cell included in the register 1196. When data holding by the logic element which inverts a logic level is selected, power supply voltage is supplied to the memory cell in the register 1196. When data holding by the memory device is selected, the data is rewritten to the memory device, and supply of power supply voltage to the memory cell in the register 1196 can be stopped.

Figure 16B:
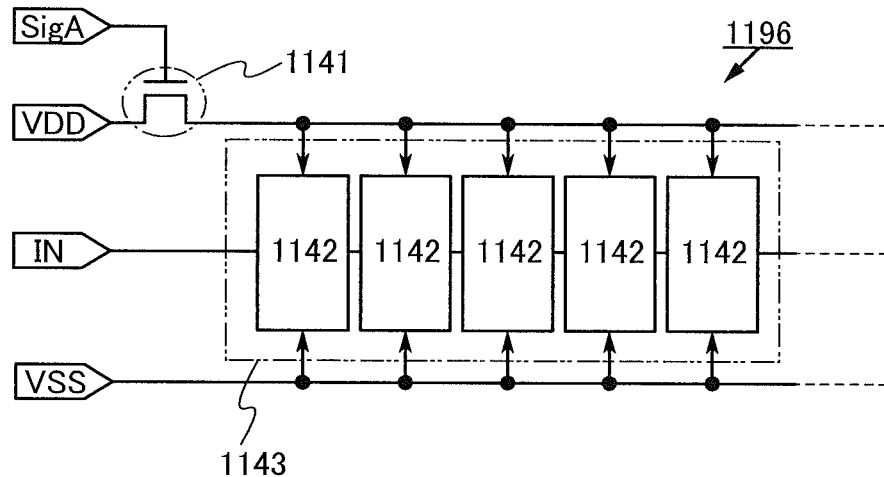
Figure 16C:
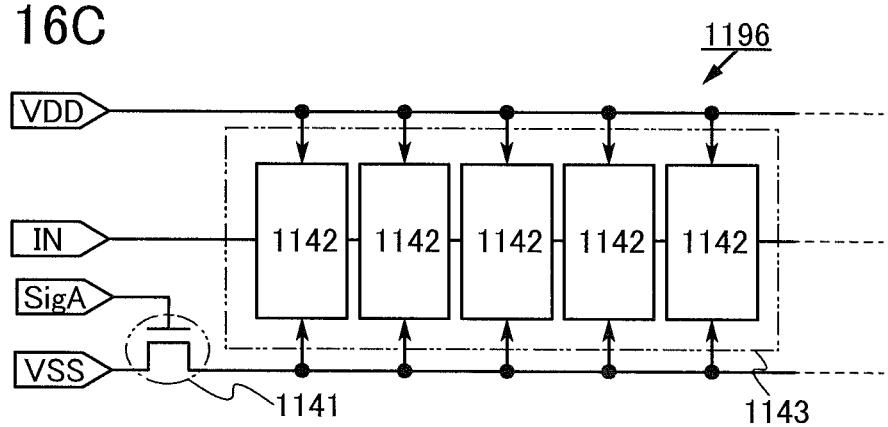

The supply of power can be stopped with a switching element provided between a memory cell group and a node to which a high-level power supply potential VDD or a power supply potential VSS is supplied, as illustrated in FIG. 16B or FIG. 16C. Circuits illustrated in FIGS. 16B and 16C will be described below.

In each of FIGS. 16B and 16C, the register 1196 includes a switching element which controls supply of power supply voltage to a memory cell.

The register 1196 illustrated in FIG. 16B includes a switching element 1141 and a memory cell group 1143 including a plurality of memory cells 1142. Specifically, each of the memory cells 1142 includes both a logic element which inverts a logic level and any of the above memory devices. Each of the memory cells 1142 included in the memory cell group 1143 is supplied with the high-level power supply potential VDD via the switching element 1141. Further, each of the memory cells 1142 included in the memory cell group 1143 is supplied with a potential of a signal IN and the low-level power supply potential VSS.

In FIG. 16B, a transistor is used as the switching element 1141, and the switching of the transistor is controlled by a signal Sig A supplied to a gate electrode thereof.

FIG. 16B illustrates the structure in which the switching element 1141 includes only one transistor. Note that the structure is not limited and the switching element 1141 may include a plurality of transistors. In the case where the switching element 1141 includes a plurality of transistors which serve as switching elements, the plurality of transistors may be connected to each other in parallel, in series, or in combination of parallel connection and series connection.

In FIG. 16C, an example of the register 1196 in which each of the memory cells 1142 included in the memory cell group 1143 is supplied with the low-level power supply potential VSS via the switching element 1141 is illustrated. The supply of the low-level power supply potential VSS to each of the memory cells 1142 included in the memory cell group 1143 can be controlled by the switching element 1141.

When a switching element is provided between a memory cell group and a node to which the power supply potential VDD or the power supply potential VSS is supplied, data can be held even in the case where operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped without losing data in the memory cell group, so that power consumption can be reduced.

Further, an electronic device including such a CPU consumes less power; therefore, the electronic device can sufficiently operate with relatively low power obtained from a solar battery or contactless power feeding (wireless feeding), for example. For example, an electronic device may include a solar battery module or a contactless power feeding module, and a secondary battery (e.g., a lithium ion battery) storing power obtained from the module.

Although the CPU is given as an example, the memory device can also be applied to an LSI such as a digital signal processor (DSP), a custom LSI, or a field programmable gate array (FPGA).

Embodiment 7

A memory device or a semiconductor device disclosed in this specification can be applied to a variety of electronic devices (including game machines). Specific examples of electronic devices are as follows: display devices such as televisions and monitors, lighting devices, desktop or laptop personal computers, word processors, image reproduction devices which reproduce still images or moving images stored in recording media such as digital versatile discs (DVDs), portable compact disc (CD) players, radio receivers, tape recorders, headphone stereos, stereos, cordless phone handsets, transceivers, portable wireless devices, cellular phones, car phones, portable game machines, calculators, portable information terminals, electronic notebooks, e-book readers, electronic translators, audio input devices, cameras such as still cameras and video cameras, electric shavers, high-frequency heating devices such as microwave ovens, electric rice cookers, electric washing machines, electric vacuum cleaners, air-conditioning systems such air conditioners, dishwashers, dish dryers, clothes dryers, futon dryers, electric refrigerators, electric freezers, electric refrigerator-freezers, freezers for preserving DNA, smoke detectors, radiation counters, and medical equipment such as dialyzers. The examples also include industrial equipment such as guide lights, traffic lights, belt conveyors, elevators, escalators, industrial robots, and power storage systems. In addition, movable objects driven by oil engines or motors using power from non-aqueous secondary batteries are also included in the category of electronic devices. Examples of the movable objects are electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats, ships, submarines, helicopters, aircrafts, rockets, artificial satellites, space probes, planetary probes, and spacecrafts. Specific examples of such electronic devices are illustrated in FIGS. 17A and 17B and FIGS. 18A to 18C.

Figure 17A:
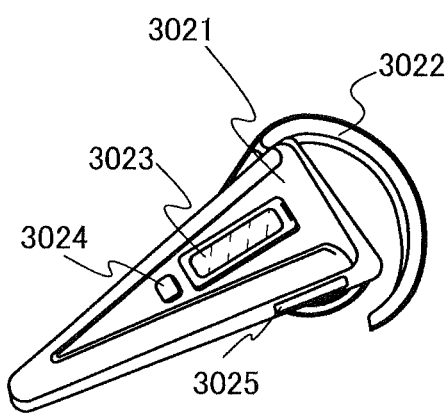
FIGS. 17A and 17B each illustrate an electronic device according to an embodiment of the present invention.

FIG. 17A illustrates a portable music player, which includes, in a main body 3021, a display portion 3023, a fixing portion 3022 with which the main body is worn on the ear, an operation button 3024, an external connection port 3025, and the like. The portable music player may include a speaker. Any of the memory devices or any of the semiconductor devices described in the above embodiments is applied to a memory, a CPU, or the like included in the main body 3021, whereby a portable music player (PDA) whose power consumption is reduced can be provided.

Furthermore, when the portable music player illustrated in FIG. 17A has an antenna, a microphone function, or a wireless communication function and is used with a mobile phone, a user can talk on the phone wirelessly in a hands-free way while driving a car or the like.

Figure 17B:
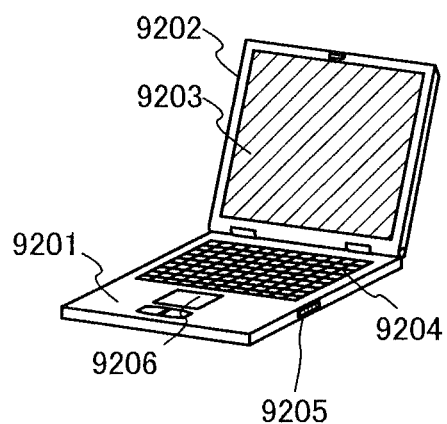

FIG. 17B illustrates a computer, which includes a main body 9201 including a CPU, a housing 9202, a display portion 9203, a keyboard 9204, an external connection port 9205, a pointing device 9206, and the like. With the use of any of the semiconductor devices described in the above embodiments, such as the memory device and the CPU, power consumption of the computer can be reduced.

Figure 18A:
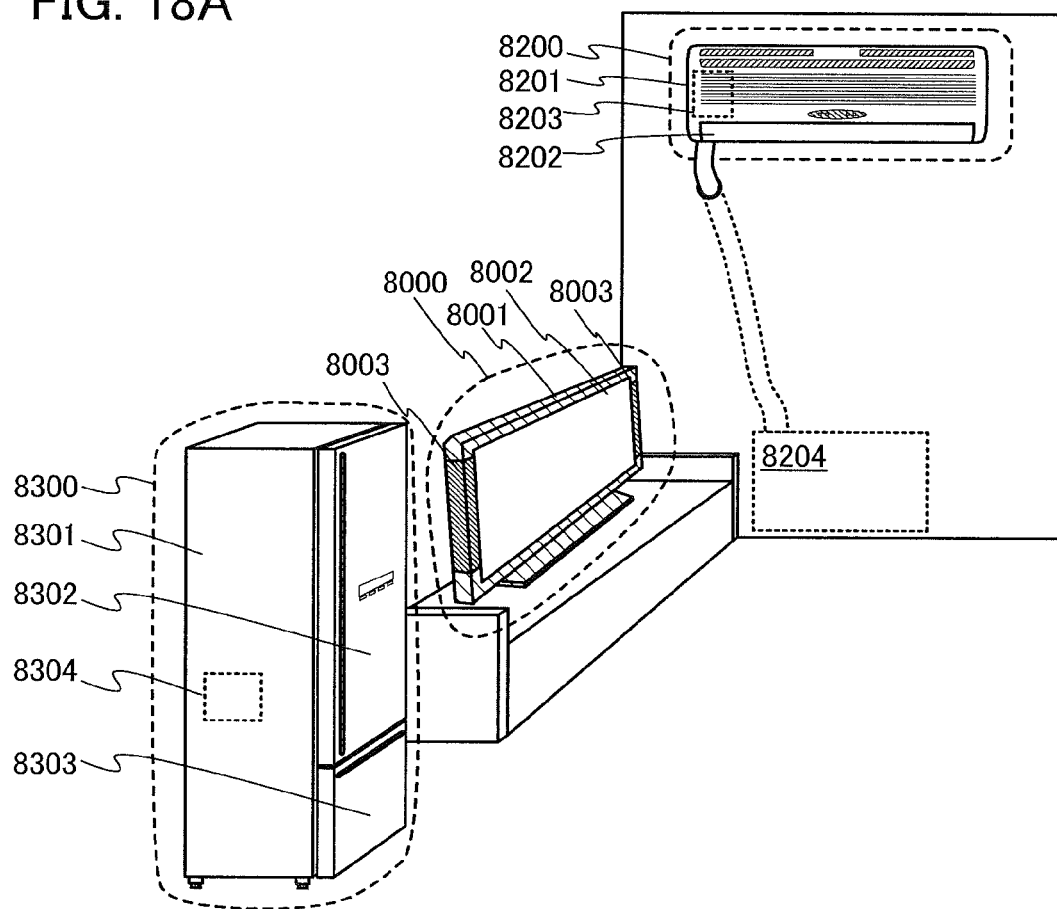
FIGS. 18A to 18C illustrate electronic devices according to embodiments of the present invention.

In a television set 8000 in FIG. 18A, a display portion 8002 is incorporated in a housing 8001. The display portion 8002 can display an image and a speaker portion 8003 can output sound. Any of the memory devices or any of the semiconductor devices described in the above embodiments can be used for a driver circuit for operating the display portion 8002 incorporated in the housing 8001.

A semiconductor display device such as a liquid crystal display device, a light-emitting device in which a light-emitting element such as an organic EL element is provided in each pixel, an electrophoretic display device, a digital micromirror device (DMD), or a plasma display panel (PDP) can be used for the display portion 8002.

The television set 8000 may be provided with a receiver, a modem, and the like. With the receiver, the television set 8000 can receive a general television broadcast. Furthermore, when the television set 8000 is connected to a communication network by wired or wireless connection via the modem, one-way (from a transmitter to a receiver) or two-way (between a transmitter and a receiver, between receivers, or the like) data communication can be performed.

In addition, the television set 8000 may include a CPU for performing information communication or a memory. The semiconductor device such as the memory device or the CPU described in the above embodiments can be used for the television set 8000.

In FIG. 18A, an air conditioner which includes an indoor unit 8200 and an outdoor unit 8204 is an example of an electronic device in which a semiconductor device such as the CPU described in the above embodiment is used. Specifically, the indoor unit 8200 includes a housing 8201, an air outlet 8202, a CPU 8203, and the like. Although the CPU 8203 is provided in the indoor unit 8200 in FIG. 18A, the CPU 8203 may be provided in the outdoor unit 8204. Alternatively, the CPU 8203 may be provided in both the indoor unit 8200 and the outdoor unit 8204. With the CPU described in the above embodiment, an air conditioner which is excellent in power saving can be provided.

In FIG. 18A, an electric refrigerator-freezer 8300 is an example of an electronic device which is provided with a semiconductor device such as the CPU described in the above embodiment. Specifically, the electric refrigerator-freezer 8300 includes a housing 8301, a door for a refrigerator 8302, a door for a freezer 8303, a CPU 8304, and the like. In FIG. 18A, the CPU 8304 is provided in the housing 8301. When a semiconductor device such as the CPU described in the above embodiment is used as the CPU 8304 of the electric refrigerator-freezer 8300, power saving can be achieved.

Figure 18B:
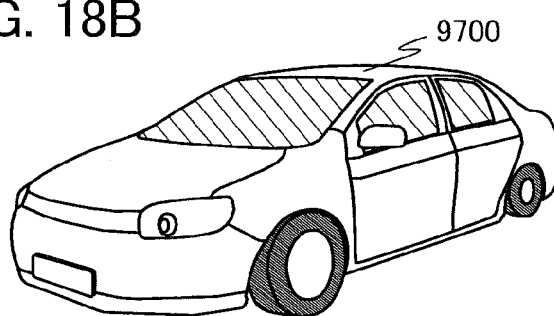
Figure 18C:
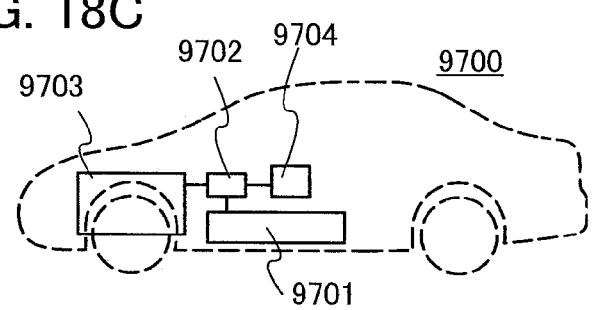

FIGS. 18B and 18C illustrate an example of an electric vehicle which is an example of an electronic device. An electric vehicle 9700 is equipped with a secondary battery 9701. The output of the electric power of the secondary battery 9701 is adjusted by a control circuit 9702 and the electric power is supplied to a driving device 9703. The control circuit 9702 is controlled by a processing unit 9704 including a ROM, a RAM, a CPU, or the like which is not illustrated. When any of the semiconductor devices described in the above embodiment, such as the memory device or the CPU, is used in the processing unit 9704 in the electric vehicle 9700, power consumption of the electric vehicle 9700 can be reduced.

The driving device 9703 includes a DC motor or an AC motor either alone or in combination with an internal-combustion engine. The processing unit 9704 outputs a control signal to the control circuit 9702 based on input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts direct current into alternate current is also incorporated.

This embodiment can be combined with any of the other embodiments disclosed in this specification as appropriate.

This application is based on Japanese Patent Application serial no. 2012-044109 filed with Japan Patent Office on Feb. 29, 2012, the entire contents of which are hereby incorporated by reference.

What is claimed is:

1. A semiconductor device comprising:
    a first transistor comprising:
        a gate electrode including an opening portion having a circular shape;
        an insulating layer wherein a side surface of the opening portion and the insulating layer overlap each other; and
        a first semiconductor layer wherein the side surface of the opening portion and the first semiconductor layer overlap each other with the insulating layer interposed therebetween; and
    a second transistor under the first transistor.

2. The semiconductor device according to claim 1,
    wherein the gate electrode includes a plurality of an opening portion having a circular shape.

3. The semiconductor device according to claim 1,
    wherein the first transistor and the second transistor overlap each other.

4. The semiconductor device according to claim 1,
    wherein a channel length direction between source and drain regions of the first transistor is perpendicular to an upper surface of a second semiconductor layer of the second transistor.

5. The semiconductor device according to claim 1,
    wherein the first transistor and the second transistor overlap each other, and
    wherein a channel length direction between source and drain regions of the first transistor is perpendicular to an upper surface of a second semiconductor layer of the second transistor.

6. The semiconductor device according to claim 4,
    wherein the first semiconductor layer comprises an oxide semiconductor, and
    wherein the second semiconductor layer comprises a material selected from single crystalline silicon, amorphous silicon, and polycrystalline silicon.

7. The semiconductor device according to claim 1, further comprising a capacitor over the second transistor,
    wherein the second transistor and the capacitor overlap each other.

8. The semiconductor device according to claim 1,
    wherein a channel region of the first transistor and a channel region of the second transistor overlap each other.

9. The semiconductor device according to claim 1,
    wherein the second transistor is located over an insulating surface.

10. An electronic device comprising the semiconductor device according to claim 1.

11. A semiconductor device comprising:
    a gate electrode including an opening portion having a circular shape;
    an insulating layer wherein a side surface of the opening portion and the insulating layer overlap each other;
    a semiconductor layer wherein the side surface of the opening portion and the semiconductor layer overlap each other with the insulating layer interposed therebetween; and
    a single crystal semiconductor substrate under the gate electrode, the insulating layer and the semiconductor layer.

12. The semiconductor device according to claim 11,
    wherein the gate electrode includes a plurality of an opening portion having a circular shape.

13. The semiconductor device according to claim 11,
    wherein the semiconductor layer comprises an oxide semiconductor.

14. The semiconductor device according to claim 11, further comprising a capacitor over the single crystal semiconductor substrate,
    wherein the single crystal semiconductor substrate and the capacitor overlap each other.

15. An electronic device comprising the semiconductor device according to claim 11.

16. A semiconductor device comprising:
    a gate electrode including an opening portion having a circular shape;
    a first insulating layer wherein a side surface of the opening portion and the insulating layer overlap each other;
    a semiconductor layer wherein the side surface of the opening portion and the semiconductor layer overlap each other with the first insulating layer interposed therebetween;
    a single crystal semiconductor substrate under the gate electrode, the first insulating layer and the semiconductor layer;
    a second insulating layer over the gate electrode, the first insulating layer and the semiconductor layer; and
    an electrode provided in a contact hole in the second insulating layer, the electrode electrically connected to the single crystal semiconductor substrate.

17. The semiconductor device according to claim 16,
    wherein the gate electrode includes a plurality of an opening portion having a circular shape.

18. The semiconductor device according to claim 16,
    wherein the semiconductor layer comprises an oxide semiconductor.

19. The semiconductor device according to claim 16, further comprising a capacitor over the single crystal semiconductor substrate,
    wherein the single crystal semiconductor substrate and the capacitor overlap each other.

20. An electronic device comprising the semiconductor device according to claim 16.

* * * * *